US008859325B2

(12) United States Patent
Lee et al.

(10) Patent No.: US 8,859,325 B2
(45) Date of Patent: Oct. 14, 2014

(54) THIN FILM DEPOSITION APPARATUS, METHOD OF MANUFACTURING ORGANIC LIGHT-EMITTING DISPLAY DEVICE BY USING THE APPARATUS, AND ORGANIC LIGHT-EMITTING DISPLAY DEVICE MANUFACTURED BY USING THE METHOD

(75) Inventors: Yun-Mi Lee, Yongin (KR); Sang-Soo Kim, Yongin (KR); Chang Mog Jo, Yongin (KR); Hyun-Sook Park, Yongin (KR)

(73) Assignee: Samsung Display Co., Ltd., Yongin-si (KR)

( * ) Notice: Subject to any disclaimer, the term of this patent is extended or adjusted under 35 U.S.C. 154(b) by 458 days.

(21) Appl. No.: 12/987,569

(22) Filed: Jan. 10, 2011

(65) Prior Publication Data
US 2011/0168986 A1    Jul. 14, 2011

(30) Foreign Application Priority Data

Jan. 14, 2010    (KR) .................. 10-2010-0003545

(51) Int. Cl.
| | |
|---|---|
| H01L 51/40 | (2006.01) |
| H01L 51/00 | (2006.01) |
| C23C 14/24 | (2006.01) |
| C23C 14/56 | (2006.01) |
| C23C 14/04 | (2006.01) |
| H01L 51/56 | (2006.01) |

(52) U.S. Cl.
CPC .......... *H01L 51/001* (2013.01); *H01L 51/0011* (2013.01); *C23C 14/243* (2013.01); *C23C 14/568* (2013.01); *C23C 14/042* (2013.01); *H01L 51/56* (2013.01)
USPC ............................................. 438/99; 257/40

(58) Field of Classification Search
USPC ............................................. 438/99; 257/40
See application file for complete search history.

(56) References Cited

U.S. PATENT DOCUMENTS

| 4,416,217 A | 11/1983 | Nakamura et al. |
|---|---|---|
| 4,468,648 A | 8/1984 | Uchikune |

(Continued)

FOREIGN PATENT DOCUMENTS

| CN | 1476279 A | 2/2004 |
|---|---|---|
| CN | 1489419 A | 4/2004 |

(Continued)

OTHER PUBLICATIONS

KIPO Registration Determination Certificate dated Jan. 13, 2012, for Korean patent application 10-2009-0056529, 5 pages.

(Continued)

*Primary Examiner* — Matthew Landau
*Assistant Examiner* — Igwe U Anya
(74) *Attorney, Agent, or Firm* — Christie, Parker & Hale, LLP

(57) ABSTRACT

A thin film deposition apparatus, a method of manufacturing an organic light-emitting display device by using the thin film deposition apparatus, and an organic light-emitting display device manufactured by using the method. The thin film deposition apparatus includes: a deposition source that discharges a deposition material; a deposition source nozzle unit disposed at a side of the deposition source and including a plurality of deposition source nozzles arranged in a first direction; a patterning slit sheet disposed opposite to the deposition source nozzle unit and including a plurality of patterning slits having different lengths arranged in the first direction; and a barrier plate assembly disposed between the deposition source nozzle unit and the patterning slit sheet in the first direction, and including a plurality of barrier plates that partition a space between the deposition source nozzle unit and the patterning slit sheet into a plurality of sub-deposition spaces, wherein the thin film deposition apparatus is separated from the substrate by a predetermined distance, and the thin film deposition apparatus and the substrate are movable relative to each other.

32 Claims, 13 Drawing Sheets

(56) References Cited

U.S. PATENT DOCUMENTS

| | | |
|---|---|---|
| 4,687,939 A | 8/1987 | Miyauchi et al. |
| 4,792,378 A | 12/1988 | Rose et al. |
| 4,901,667 A | 2/1990 | Suzuki et al. |
| 5,454,847 A | 10/1995 | Jacoboni et al. |
| 5,460,654 A | 10/1995 | Kikkawa et al. |
| 5,487,609 A | 1/1996 | Asada |
| 5,742,129 A * | 4/1998 | Nagayama et al. ............ 315/167 |
| 5,909,995 A | 6/1999 | Wolf et al. |
| 6,045,671 A | 4/2000 | Wu et al. |
| 6,091,195 A | 7/2000 | Forrest et al. |
| 6,099,649 A | 8/2000 | Schmitt et al. |
| 6,274,198 B1 | 8/2001 | Dautartas |
| 6,280,821 B1 | 8/2001 | Kadunce et al. |
| 6,371,451 B1 | 4/2002 | Choi |
| 6,417,034 B2 | 7/2002 | Kitazume et al. |
| 6,443,597 B1 | 9/2002 | Natori |
| 6,483,690 B1 | 11/2002 | Nakajima et al. |
| 6,541,130 B2 | 4/2003 | Fukuda |
| 6,554,969 B1 | 4/2003 | Chong |
| 6,579,422 B1 | 6/2003 | Kakinuma |
| 6,589,673 B1 | 7/2003 | Kido et al. |
| 6,650,023 B2 | 11/2003 | Kim |
| 6,699,324 B1 | 3/2004 | Berdin et al. |
| 6,749,906 B2 | 6/2004 | Van Slyke |
| 6,776,847 B2 | 8/2004 | Yamazaki et al. |
| 6,837,939 B1 | 1/2005 | Klug et al. |
| 6,878,209 B2 | 4/2005 | Himeshima et al. |
| 6,946,783 B2 | 9/2005 | Kim |
| 6,995,035 B2 | 2/2006 | Cok et al. |
| 7,006,202 B2 | 2/2006 | Byun et al. |
| RE39,024 E | 3/2006 | Takahashi |
| 7,078,070 B2 | 7/2006 | Peng |
| 7,199,520 B2 | 4/2007 | Fujii et al. |
| 7,322,248 B1 | 1/2008 | Long et al. |
| 7,495,389 B2 | 2/2009 | Noguchi et al. |
| 7,601,439 B2 | 10/2009 | Chun et al. |
| 7,776,457 B2 | 8/2010 | Lee et al. |
| 7,872,256 B2 | 1/2011 | Sung et al. |
| 7,910,386 B2 | 3/2011 | Shiang et al. |
| 7,964,037 B2 | 6/2011 | Fukuda et al. |
| 8,022,448 B1 | 9/2011 | Luu et al. |
| 8,128,753 B2 | 3/2012 | Bulovic et al. |
| 8,137,466 B2 | 3/2012 | Kang et al. |
| 8,188,476 B2 | 5/2012 | Takagi et al. |
| 8,193,011 B2 * | 6/2012 | Kang et al. ...................... 438/22 |
| 2001/0006827 A1 | 7/2001 | Yamazaki et al. |
| 2001/0019807 A1 | 9/2001 | Yamada et al. |
| 2001/0026638 A1 | 10/2001 | Sangu et al. |
| 2001/0034175 A1 | 10/2001 | Miyazaki et al. |
| 2002/0011785 A1 | 1/2002 | Tang et al. |
| 2002/0017245 A1 | 2/2002 | Tsubaki et al. |
| 2002/0033136 A1 | 3/2002 | Savage et al. |
| 2002/0036759 A1 | 3/2002 | Ise et al. |
| 2002/0050061 A1 | 5/2002 | Komyoji et al. |
| 2002/0076847 A1 | 6/2002 | Yamada et al. |
| 2002/0168577 A1 | 11/2002 | Yoon |
| 2002/0179013 A1 | 12/2002 | Kido et al. |
| 2002/0187253 A1 | 12/2002 | Marcus et al. |
| 2002/0194727 A1 | 12/2002 | Cho et al. |
| 2002/0197393 A1 | 12/2002 | Kuwabara |
| 2003/0101932 A1 | 6/2003 | Kang |
| 2003/0101937 A1 | 6/2003 | Van Slyke et al. |
| 2003/0117602 A1 | 6/2003 | Kobayashi et al. |
| 2003/0118950 A1 * | 6/2003 | Chao et al. ..................... 430/321 |
| 2003/0124764 A1 | 7/2003 | Yamazaki et al. |
| 2003/0151637 A1 | 8/2003 | Nakamura et al. |
| 2003/0164934 A1 | 9/2003 | Nishi et al. |
| 2003/0168013 A1 | 9/2003 | Freeman et al. |
| 2003/0173896 A1 | 9/2003 | Grushin et al. |
| 2003/0221614 A1 | 12/2003 | Kang et al. |
| 2003/0221620 A1 | 12/2003 | Yamazaki |
| 2003/0232563 A1 | 12/2003 | Kamiyama et al. |
| 2004/0016907 A1 | 1/2004 | Shi |
| 2004/0029028 A1 | 2/2004 | Shimizu |
| 2004/0056244 A1 | 3/2004 | Marcus et al. |
| 2004/0086639 A1 | 5/2004 | Grantham et al. |
| 2004/0096771 A1 | 5/2004 | Kashiwagi et al. |
| 2004/0115338 A1 | 6/2004 | Yoneda |
| 2004/0115342 A1 | 6/2004 | Shigemura |
| 2004/0123804 A1 | 7/2004 | Yamazaki et al. |
| 2004/0127066 A1 | 7/2004 | Jung |
| 2004/0134428 A1 | 7/2004 | Sasaki et al. |
| 2004/0142108 A1 | 7/2004 | Atobe et al. |
| 2004/0144321 A1 | 7/2004 | Grace et al. |
| 2004/0157167 A1 | 8/2004 | Morii |
| 2004/0183435 A1 | 9/2004 | Ohshita |
| 2004/0194702 A1 | 10/2004 | Sasaki et al. |
| 2004/0195530 A1 | 10/2004 | Kwak et al. |
| 2004/0216673 A1 | 11/2004 | Sakata et al. |
| 2004/0255857 A1 | 12/2004 | Chow et al. |
| 2004/0263547 A1 | 12/2004 | Sugahara |
| 2004/0263771 A1 | 12/2004 | Jeong et al. |
| 2005/0001546 A1 | 1/2005 | Yamaguchi |
| 2005/0016461 A1 | 1/2005 | Klug et al. |
| 2005/0031836 A1 | 2/2005 | Hirai |
| 2005/0037136 A1 | 2/2005 | Yamamoto |
| 2005/0039684 A1 | 2/2005 | Yi et al. |
| 2005/0072359 A1 | 4/2005 | Kim |
| 2005/0072361 A1 | 4/2005 | Yang et al. |
| 2005/0079418 A1 | 4/2005 | Kelley et al. |
| 2005/0110400 A1 | 5/2005 | Nakamura |
| 2005/0129489 A1 | 6/2005 | Quan et al. |
| 2005/0153472 A1 | 7/2005 | Yotsuya |
| 2005/0166842 A1 | 8/2005 | Sakamoto |
| 2005/0166844 A1 | 8/2005 | Gralenski |
| 2005/0183670 A1 | 8/2005 | Grantham et al. |
| 2005/0186330 A1 | 8/2005 | Kim et al. |
| 2005/0213021 A1 | 9/2005 | Myoung |
| 2005/0217584 A1 | 10/2005 | Abiko et al. |
| 2005/0229848 A1 | 10/2005 | Shinriki et al. |
| 2005/0244580 A1 | 11/2005 | Cok et al. |
| 2005/0263074 A1 | 12/2005 | Masuda et al. |
| 2006/0011136 A1 | 1/2006 | Yamazaki et al. |
| 2006/0012771 A1 | 1/2006 | Jeong |
| 2006/0022590 A1 | 2/2006 | Aziz et al. |
| 2006/0040132 A1 | 2/2006 | Liao et al. |
| 2006/0045958 A1 | 3/2006 | Abiko et al. |
| 2006/0066231 A1 | 3/2006 | Nishikawa et al. |
| 2006/0090705 A1 | 5/2006 | Kim |
| 2006/0102078 A1 | 5/2006 | Fairbairn et al. |
| 2006/0110544 A1 | 5/2006 | Kim et al. |
| 2006/0113907 A1 | 6/2006 | Im et al. |
| 2006/0115585 A1 | 6/2006 | Bulovic et al. |
| 2006/0130766 A1 | 6/2006 | Kim et al. |
| 2006/0144325 A1 | 7/2006 | Jung et al. |
| 2006/0152641 A1 * | 7/2006 | Brody ............................. 349/38 |
| 2006/0164786 A1 | 7/2006 | Kobayashi et al. |
| 2006/0169211 A1 | 8/2006 | Kim et al. |
| 2006/0174829 A1 | 8/2006 | An et al. |
| 2006/0205101 A1 | 9/2006 | Lee et al. |
| 2006/0244696 A1 | 11/2006 | Jung et al. |
| 2006/0267294 A1 | 11/2006 | Busse et al. |
| 2006/0269671 A1 | 11/2006 | Kim et al. |
| 2006/0272572 A1 | 12/2006 | Uematsu et al. |
| 2006/0278522 A1 | 12/2006 | Kim et al. |
| 2006/0278945 A1 | 12/2006 | Sakurai |
| 2006/0280588 A1 | 12/2006 | Blonigan et al. |
| 2007/0009552 A1 | 1/2007 | Whitehead et al. |
| 2007/0009652 A1 | 1/2007 | Manz et al. |
| 2007/0017445 A1 | 1/2007 | Takehara et al. |
| 2007/0022955 A1 | 2/2007 | Bender et al. |
| 2007/0024185 A1 | 2/2007 | Kitamura et al. |
| 2007/0046185 A1 | 3/2007 | Kim |
| 2007/0046913 A1 | 3/2007 | Shibazaki |
| 2007/0054044 A1 | 3/2007 | Shimosaki et al. |
| 2007/0075955 A1 | 4/2007 | Jung et al. |
| 2007/0077358 A1 | 4/2007 | Jeong et al. |
| 2007/0148337 A1 | 6/2007 | Nichols et al. |
| 2007/0148348 A1 | 6/2007 | Huh et al. |
| 2007/0157879 A1 | 7/2007 | Yotsuya |
| 2007/0158471 A1 | 7/2007 | Park et al. |
| 2007/0163497 A1 | 7/2007 | Grace et al. |
| 2007/0178708 A1 | 8/2007 | Ukigaya |
| 2007/0190235 A1 | 8/2007 | Yamazaki et al. |

(56) References Cited

U.S. PATENT DOCUMENTS

| | | |
|---|---|---|
| 2007/0195844 A1 | 8/2007 | Ma et al. |
| 2007/0231460 A1 | 10/2007 | Ukigaya |
| 2007/0275497 A1 | 11/2007 | Kwack et al. |
| 2007/0297887 A1 | 12/2007 | Tanaka |
| 2008/0018236 A1 | 1/2008 | Arai et al. |
| 2008/0057183 A1 | 3/2008 | Spindler et al. |
| 2008/0100204 A1 | 5/2008 | Kim |
| 2008/0115729 A1 | 5/2008 | Oda et al. |
| 2008/0118743 A1 | 5/2008 | Lee et al. |
| 2008/0129194 A1 | 6/2008 | Abe et al. |
| 2008/0131587 A1 | 6/2008 | Boroson et al. |
| 2008/0145521 A1 | 6/2008 | Guo et al. |
| 2008/0174235 A1 | 7/2008 | Kim et al. |
| 2008/0216741 A1 | 9/2008 | Ling et al. |
| 2008/0238294 A1* | 10/2008 | Xu et al. ................. 313/498 |
| 2008/0286461 A1 | 11/2008 | Noguchi et al. |
| 2008/0298947 A1 | 12/2008 | Yeo et al. |
| 2008/0309718 A1 | 12/2008 | Oya et al. |
| 2009/0001882 A1 | 1/2009 | Park et al. |
| 2009/0017192 A1 | 1/2009 | Matsuura |
| 2009/0124033 A1 | 5/2009 | Moriyama |
| 2009/0133629 A1 | 5/2009 | Kamikawa et al. |
| 2009/0153033 A1 | 6/2009 | Lee et al. |
| 2009/0165713 A1 | 7/2009 | Kim et al. |
| 2009/0169868 A1 | 7/2009 | Haglund, Jr. et al. |
| 2009/0181163 A1 | 7/2009 | Uetake |
| 2009/0208754 A1 | 8/2009 | Chu et al. |
| 2009/0220691 A1 | 9/2009 | Kim |
| 2009/0229524 A1 | 9/2009 | Kim et al. |
| 2009/0232976 A1 | 9/2009 | Yoon et al. |
| 2009/0269881 A1 | 10/2009 | Furuta et al. |
| 2009/0277386 A1 | 11/2009 | Takagi et al. |
| 2009/0279173 A1 | 11/2009 | Chui et al. |
| 2009/0302750 A1 | 12/2009 | Jun et al. |
| 2009/0304906 A1 | 12/2009 | Suduo et al. |
| 2009/0304924 A1 | 12/2009 | Gadgil |
| 2009/0308317 A1 | 12/2009 | Sone et al. |
| 2009/0315456 A1 | 12/2009 | Furukawa et al. |
| 2010/0001301 A1 | 1/2010 | Karg et al. |
| 2010/0055810 A1 | 3/2010 | Sung et al. |
| 2010/0086672 A1 | 4/2010 | Von Drasek et al. |
| 2010/0089443 A1 | 4/2010 | Bloomstein et al. |
| 2010/0090594 A1 | 4/2010 | Choi et al. |
| 2010/0156279 A1 | 6/2010 | Tamura et al. |
| 2010/0165454 A1 | 7/2010 | Suetsugu et al. |
| 2010/0170439 A1 | 7/2010 | Negishi |
| 2010/0192856 A1 | 8/2010 | Sung et al. |
| 2010/0196607 A1 | 8/2010 | Carlson et al. |
| 2010/0255198 A1 | 10/2010 | Cleary et al. |
| 2010/0271602 A1 | 10/2010 | Hanazaki |
| 2010/0275842 A1 | 11/2010 | Park et al. |
| 2010/0297348 A1 | 11/2010 | Lee et al. |
| 2010/0297349 A1 | 11/2010 | Lee et al. |
| 2010/0310768 A1 | 12/2010 | Lee et al. |
| 2010/0328197 A1 | 12/2010 | Lee et al. |
| 2010/0330265 A1 | 12/2010 | Lee et al. |
| 2010/0330712 A1 | 12/2010 | Lee et al. |
| 2011/0033619 A1 | 2/2011 | Lee et al. |
| 2011/0033621 A1 | 2/2011 | Lee et al. |
| 2011/0042659 A1 | 2/2011 | Kim et al. |
| 2011/0045617 A1* | 2/2011 | Kang et al. .................. 438/22 |
| 2011/0048320 A1 | 3/2011 | Choi et al. |
| 2011/0052791 A1 | 3/2011 | Jo et al. |
| 2011/0052795 A1 | 3/2011 | Choi et al. |
| 2011/0053296 A1 | 3/2011 | Lee et al. |
| 2011/0053300 A1 | 3/2011 | Ryu et al. |
| 2011/0068331 A1 | 3/2011 | Koh et al. |
| 2011/0123707 A1 | 5/2011 | Lee et al. |
| 2011/0165327 A1 | 7/2011 | Park et al. |
| 2011/0168986 A1 | 7/2011 | Lee et al. |
| 2011/0220019 A1 | 9/2011 | Lee et al. |
| 2011/0241438 A1 | 10/2011 | Kim et al. |
| 2011/0262625 A1 | 10/2011 | Park et al. |
| 2011/0266944 A1 | 11/2011 | Song et al. |
| 2012/0009328 A1 | 1/2012 | Ryu et al. |
| 2012/0009332 A1 | 1/2012 | Kim et al. |
| 2012/0009706 A1 | 1/2012 | Choi et al. |
| 2012/0083061 A1 | 4/2012 | Kang et al. |
| 2012/0097992 A1 | 4/2012 | Jeong |
| 2012/0145077 A1 | 6/2012 | Chang et al. |
| 2012/0148743 A1 | 6/2012 | Bulovic et al. |
| 2012/0174865 A1 | 7/2012 | Choi et al. |
| 2012/0175605 A1 | 7/2012 | Shin et al. |
| 2012/0214263 A1 | 8/2012 | Yamazaki et al. |
| 2012/0299023 A1 | 11/2012 | Lee et al. |
| 2012/0313251 A1* | 12/2012 | Kato ............................ 257/773 |
| 2013/0001528 A1 | 1/2013 | Chang et al. |

FOREIGN PATENT DOCUMENTS

| | | |
|---|---|---|
| CN | 1500904 A | 6/2004 |
| CN | 1556872 A | 12/2004 |
| CN | 1607868 A | 4/2005 |
| CN | 1682569 A | 10/2005 |
| CN | 1704501 A | 12/2005 |
| CN | 1814854 A | 8/2006 |
| CN | 1841696 A | 10/2006 |
| EP | 1 413 644 | 4/2004 |
| EP | 1 418 250 | 5/2004 |
| EP | 1 518 940 | 3/2005 |
| JP | 57-194252 A2 | 11/1982 |
| JP | 2-247372 | 10/1990 |
| JP | 4-272170 | 9/1992 |
| JP | 5-22405 U1 | 3/1993 |
| JP | 5-98425 A2 | 4/1993 |
| JP | 5-230628 A2 | 9/1993 |
| JP | 8-27568 A2 | 1/1996 |
| JP | 9-95776 A2 | 4/1997 |
| JP | 10-50478 | 2/1998 |
| JP | 10-120171 | 5/1998 |
| JP | 10-270535 | 10/1998 |
| JP | 11-144865 | 5/1999 |
| JP | 2000-68054 | 3/2000 |
| JP | 2000-282219 | 10/2000 |
| JP | 2000-323277 | 11/2000 |
| JP | 2001-28325 A2 | 1/2001 |
| JP | 2001-52862 | 2/2001 |
| JP | 2001-93667 | 4/2001 |
| JP | 2002-075638 | 3/2002 |
| JP | 2002-175878 | 6/2002 |
| JP | 2002-348659 A2 | 12/2002 |
| JP | 2003-3250 | 1/2003 |
| JP | 2003-77662 | 3/2003 |
| JP | 2003-157973 | 5/2003 |
| JP | 2003-197531 A2 | 7/2003 |
| JP | 2003-297562 | 10/2003 |
| JP | 2003-321767 | 11/2003 |
| JP | 2003-347394 A2 | 12/2003 |
| JP | 2004-035964 A2 | 2/2004 |
| JP | 2004-43898 | 2/2004 |
| JP | 2004-76150 A2 | 3/2004 |
| JP | 2004-91858 A2 | 3/2004 |
| JP | 2004-103269 | 4/2004 |
| JP | 2004-103341 | 4/2004 |
| JP | 2004-107764 A2 | 4/2004 |
| JP | 2004-137583 A2 | 5/2004 |
| JP | 2004-143521 A2 | 5/2004 |
| JP | 2004-169169 | 6/2004 |
| JP | 2004-199919 | 7/2004 |
| JP | 2004-225058 | 8/2004 |
| JP | 2004-342455 A2 | 12/2004 |
| JP | 2004-349101 | 12/2004 |
| JP | 2004-355975 | 12/2004 |
| JP | 2005-44592 | 2/2005 |
| JP | 2005-101505 | 4/2005 |
| JP | 2005-122980 | 5/2005 |
| JP | 2005-165015 A2 | 6/2005 |
| JP | 2005-174843 | 6/2005 |
| JP | 2005-206939 A2 | 8/2005 |
| JP | 2005-213616 A2 | 8/2005 |
| JP | 2005-235568 | 9/2005 |
| JP | 2005-293968 | 10/2005 |
| JP | 2005-296737 | 10/2005 |
| JP | 2006-28583 A2 | 2/2006 |

(56) References Cited

FOREIGN PATENT DOCUMENTS

| | | |
|---|---|---|
| JP | 2006-172930 A2 | 6/2006 |
| JP | 2006-176809 A2 | 7/2006 |
| JP | 2006-210038 | 8/2006 |
| JP | 2006-219760 | 8/2006 |
| JP | 2006-275433 | 10/2006 |
| JP | 2006-292955 A2 | 10/2006 |
| JP | 2006-307247 A2 | 11/2006 |
| JP | 2007-47293 | 2/2007 |
| JP | 2007-66862 | 3/2007 |
| JP | 2007-146219 | 6/2007 |
| JP | 2007-157886 | 6/2007 |
| JP | 2007-186740 | 7/2007 |
| JP | 2007-242436 | 9/2007 |
| JP | 2007-291506 A2 | 11/2007 |
| JP | 2008-19477 A2 | 1/2008 |
| JP | 2008-108628 | 5/2008 |
| JP | 2008-121098 | 5/2008 |
| JP | 2008-521165 | 6/2008 |
| JP | 2008-196003 | 8/2008 |
| JP | 2008-248301 A2 | 10/2008 |
| JP | 2008-300056 | 12/2008 |
| JP | 2009-19243 | 1/2009 |
| JP | 2009-24208 A2 | 2/2009 |
| JP | 2009-049223 | 3/2009 |
| JP | 2009-81165 A2 | 4/2009 |
| JP | 2009-87910 | 4/2009 |
| JP | 2009-117231 A2 | 5/2009 |
| JP | 2010-159167 A2 | 7/2010 |
| JP | 2010-261081 A2 | 11/2010 |
| JP | 2011-47035 | 3/2011 |
| JP | 2011-146377 | 7/2011 |
| JP | 2012-211352 | 11/2012 |
| KR | 1997-0008709 A | 2/1997 |
| KR | 10-0257219 | 2/2000 |
| KR | 10-2000-0019254 | 4/2000 |
| KR | 10-2000-0023929 | 5/2000 |
| KR | 10-2001-0024652 | 3/2001 |
| KR | 2001-0030175 A | 4/2001 |
| KR | 10-2001-0039298 A | 5/2001 |
| KR | 10-2001-0059939 | 7/2001 |
| KR | 10-2001-0092914 A | 10/2001 |
| KR | 2001-0093666 A | 10/2001 |
| KR | 20-0257218 Y1 | 12/2001 |
| KR | 10-2002-0000201 | 1/2002 |
| KR | 10-2002-0001555 | 1/2002 |
| KR | 10-2002-0050922 | 6/2002 |
| KR | 2002-0088662 A | 11/2002 |
| KR | 10-2002-0090934 | 12/2002 |
| KR | 10-2002-0091457 A | 12/2002 |
| KR | 10-2003-0001745 | 1/2003 |
| KR | 2003-0034730 A | 5/2003 |
| KR | 10-2003-0043012 A | 6/2003 |
| KR | 10-2003-0046090 | 6/2003 |
| KR | 2003-0069684 | 8/2003 |
| KR | 10-0405080 | 10/2003 |
| KR | 10-0406059 B1 | 11/2003 |
| KR | 10-2003-0091947 | 12/2003 |
| KR | 10-2003-0093959 | 12/2003 |
| KR | 2003-0094033 A | 12/2003 |
| KR | 10-2004-0014258 A | 2/2004 |
| KR | 20-0342433 Y1 | 2/2004 |
| KR | 10-2004-0034537 | 4/2004 |
| KR | 10-2004-0039910 A | 5/2004 |
| KR | 10-0430336 B1 | 5/2004 |
| KR | 10-2004-0050045 | 6/2004 |
| KR | 10-2004-0069281 | 8/2004 |
| KR | 10-2004-0084747 | 10/2004 |
| KR | 10-2004-0087142 A | 10/2004 |
| KR | 10-2004-0110718 A | 12/2004 |
| KR | 10-0463212 | 12/2004 |
| KR | 10-2005-0018234 A | 2/2005 |
| KR | 10-2004-0024324 A | 3/2005 |
| KR | 10-2005-0028943 | 3/2005 |
| KR | 10-2005-0039140 A | 4/2005 |
| KR | 10-0483487 B1 | 4/2005 |
| KR | 10-2005-0062853 | 6/2005 |
| KR | 10-2005-0082644 A | 8/2005 |
| KR | 10-0520159 | 9/2005 |
| KR | 10-0532657 B1 | 12/2005 |
| KR | 10-2006-0008602 | 1/2006 |
| KR | 10-2006-0018745 | 3/2006 |
| KR | 2006-0020050 | 3/2006 |
| KR | 10-2006-0045225 A | 5/2006 |
| KR | 10-2006-0051746 A | 5/2006 |
| KR | 10-2006-0053926 A | 5/2006 |
| KR | 10-2006-0056706 | 5/2006 |
| KR | 10-2006-0058459 | 5/2006 |
| KR | 10-2009-0052828 A | 5/2006 |
| KR | 2006-0049050 | 5/2006 |
| KR | 10-2006-0059323 A | 6/2006 |
| KR | 10-2006-0060994 | 6/2006 |
| KR | 10-2006-0065978 | 6/2006 |
| KR | 10-2006-0073367 | 6/2006 |
| KR | 2006-0059068 | 6/2006 |
| KR | 10-2006-0077887 A | 7/2006 |
| KR | 10-2006-0080475 | 7/2006 |
| KR | 10-2006-0080481 | 7/2006 |
| KR | 10-2006-0080482 | 7/2006 |
| KR | 10-2006-0081943 A | 7/2006 |
| KR | 10-2006-0083510 | 7/2006 |
| KR | 10-2006-0092387 | 8/2006 |
| KR | 10-2006-0098755 | 9/2006 |
| KR | 10-2006-0104288 A | 10/2006 |
| KR | 10-2006-0104675 | 10/2006 |
| KR | 10-2006-0104677 | 10/2006 |
| KR | 10-2006-0109561 A | 10/2006 |
| KR | 10-2006-0109627 | 10/2006 |
| KR | 10-0635903 B1 | 10/2006 |
| KR | 10-2006-0114462 A | 11/2006 |
| KR | 10-2006-0114477 A | 11/2006 |
| KR | 10-2006-0114573 A | 11/2006 |
| KR | 10-0645719 B1 | 11/2006 |
| KR | 10-0646160 | 11/2006 |
| KR | 10-2006-0123944 A | 12/2006 |
| KR | 10-0687007 | 2/2007 |
| KR | 10-2007-0025164 | 3/2007 |
| KR | 10-0696547 | 3/2007 |
| KR | 10-0696550 B1 | 3/2007 |
| KR | 10-0697663 B1 | 3/2007 |
| KR | 10-0698033 | 3/2007 |
| KR | 10-0700466 | 3/2007 |
| KR | 10-2007-0035796 | 4/2007 |
| KR | 10-2007-0037848 A | 4/2007 |
| KR | 10-0711885 | 4/2007 |
| KR | 10-2007-0050793 | 5/2007 |
| KR | 10-0723627 | 5/2007 |
| KR | 10-2007-0056190 A | 6/2007 |
| KR | 10-0726132 | 6/2007 |
| KR | 10-0736218 B1 | 7/2007 |
| KR | 10-0739309 B1 | 7/2007 |
| KR | 10-0741142 B1 | 7/2007 |
| KR | 10-2007-0078713 | 8/2007 |
| KR | 10-2007-0080635 | 8/2007 |
| KR | 10-2007-0091437 A | 9/2007 |
| KR | 10-2006-0028115 | 10/2007 |
| KR | 10-2007-0097218 | 10/2007 |
| KR | 10-2007-0098122 A | 10/2007 |
| KR | 10-2007-0101842 | 10/2007 |
| KR | 10-2007-0105595 | 10/2007 |
| KR | 10-0768212 B1 | 10/2007 |
| KR | 10-0770653 | 10/2007 |
| KR | 10-2007-0112668 | 11/2007 |
| KR | 10-2007-0114094 A | 11/2007 |
| KR | 10-0787457 B1 | 12/2007 |
| KR | 10-2008-0001184 | 1/2008 |
| KR | 10-2008-0003720 A | 1/2008 |
| KR | 10-2008-0007896 A | 1/2008 |
| KR | 10-2008-0009285 A | 1/2008 |
| KR | 10-0797787 | 1/2008 |
| KR | 10-0800125 | 1/2008 |
| KR | 10-0815265 | 3/2008 |
| KR | 10-2008-0036983 A | 4/2008 |
| KR | 10-0823508 | 4/2008 |
| KR | 10-0823511 B1 | 4/2008 |

(56) References Cited

FOREIGN PATENT DOCUMENTS

| KR | 10-0827760 | | 4/2008 |
|---|---|---|---|
| KR | 10-2008-0044239 | A | 5/2008 |
| KR | 10-2008-0044775 | | 5/2008 |
| KR | 10-2008-0046761 | A | 5/2008 |
| KR | 10-2008-0048653 | | 6/2008 |
| KR | 10-2008-0055124 | A | 6/2008 |
| KR | 10-2008-0057159 | A | 6/2008 |
| KR | 10-0839380 | | 6/2008 |
| KR | 10-2008-0060400 | | 7/2008 |
| KR | 10-2008-0061132 | | 7/2008 |
| KR | 10-2008-0061666 | A | 7/2008 |
| KR | 10-2008-0061774 | A | 7/2008 |
| KR | 10-2008-0062212 | | 7/2008 |
| KR | 10-0899279 | B1 | 7/2008 |
| KR | 10-2008-0076574 | A | 8/2008 |
| KR | 10-2008-0088737 | A | 10/2008 |
| KR | 10-2008-0104479 | A | 12/2008 |
| KR | 10-2008-0104695 | A | 12/2008 |
| KR | 10-2008-0109559 | | 12/2008 |
| KR | 10-2009-0017910 | A | 2/2009 |
| KR | 10-0889872 | B1 | 3/2009 |
| KR | 10-2009-0038733 | | 4/2009 |
| KR | 10-2009-0040618 | | 4/2009 |
| KR | 10-2009-0047953 | A | 5/2009 |
| KR | 10-2009-0052155 | | 5/2009 |
| KR | 10-2009-0053417 | | 5/2009 |
| KR | 10-2009-0066996 | A | 6/2009 |
| KR | 10-2009-0075887 | A | 7/2009 |
| KR | 10-2009-0081717 | A | 7/2009 |
| KR | 10-0908232 | B1 | 7/2009 |
| KR | 10-2009-0093161 | | 9/2009 |
| KR | 10-2009-0094911 | A | 9/2009 |
| KR | 10-2009-0097453 | | 9/2009 |
| KR | 10-2009-0107702 | | 10/2009 |
| KR | 10-2010-0000128 | | 1/2010 |
| KR | 10-2010-0000129 | | 1/2010 |
| KR | 10-2010-0002381 | A | 1/2010 |
| KR | 10-2010-0026655 | | 3/2010 |
| KR | 10-2010-0038088 | A | 4/2010 |
| KR | 10-2010-0044606 | A | 4/2010 |
| KR | 10-2010-0047796 | | 5/2010 |
| KR | 10-0961110 | B1 | 6/2010 |
| KR | 10-2010-0090070 | | 8/2010 |
| KR | 10-2010-0099806 | A | 9/2010 |
| KR | 10-2010-0119368 | A | 11/2010 |
| KR | 10-2010-0126125 | A | 12/2010 |
| KR | 10-2010-0128589 | A | 12/2010 |
| KR | 10-2010-0130786 | A | 12/2010 |
| KR | 10-2010-0133678 | A | 12/2010 |
| KR | 10-2010-0138139 | A | 12/2010 |
| KR | 10-1017654 | B1 | 2/2011 |
| KR | 10-2011-0021090 | A | 3/2011 |
| KR | 10-2011-0022512 | A | 3/2011 |
| KR | 10-2011-0032589 | A | 3/2011 |
| KR | 10-2011-0082418 | A | 7/2011 |
| KR | 10-2011-0101767 | | 9/2011 |
| KR | 10-2011-0110525 | A | 10/2011 |
| KR | 10-2011-0120213 | A | 11/2011 |
| KR | 10-2011-0138787 | A | 12/2011 |
| KR | 10-2012-0006322 | A | 1/2012 |
| KR | 10-2012-0006324 | A | 1/2012 |
| KR | 10-2012-0042155 | A | 5/2012 |
| KR | 10-2012-0065789 | A | 6/2012 |
| KR | 10-2012-0080855 | A | 7/2012 |
| KR | 10-2012-0081811 | A | 7/2012 |
| KR | 10-2012-0131545 | A | 12/2012 |
| KR | 10-2013-0007308 | A | 1/2013 |
| WO | WO 99/25894 | A1 | 5/1999 |
| WO | 03043067 | A1 | 5/2003 |
| WO | WO2004016406 | A1 | 2/2004 |
| WO | 2008004792 | A1 | 1/2008 |

OTHER PUBLICATIONS

KIPO Office action dated Feb. 1, 2012, for Korean patent application 10-2010-0031848, 4 pages.
KIPO Registration Determination Certificate dated Sep. 28, 2011, for Korean Patent application 10-2009-0052357, 5 pages.
KIPO Registration Determination Certificate dated Nov. 25, 2011, for Korean Patent application 10-2010-0014277, 5 pages.
KIPO Office action dated Feb. 1, 2012, for Korean patent application 10-2010-0011196, 4 pages.
KIPO Registration Determination Certificate dated Jul. 20, 2012, for Korean priority Patent application 10-2010-0003545, (5 pages).
KIPO Registration Determination Certificate dated Apr. 30, 2012, for Korean priority Patent application 10-2010-0066992, (5 pages).
English-language abstract of Korean Publication No. KR 10-2002-0034272.
English-language abstract of Korean Publication No. KR 10-2002-0056238.
English-language abstract of Korean Publication No. KR 10-2002-0088662.
English-language abstract of Korean Publication No. KR 10-2005-0045619.
English-language abstract of Korean Publication No. KR 10-2006-0126267.
English-language abstract of Korean Publication No. KR 10-2008-0038650.
U.S. Appl. No. 12/784,774, filed May 21, 2010, Choong-Ho Lee et al., Samsung Mobile Display Co., Ltd.
U.S. Appl. No. 13/014,225, filed Jan. 26, 2011, Jong-Won Hong et al., Samsung Mobile Display Co., Ltd.
U.S. Appl. No. 12/797,858, filed Jun. 10, 2010, Choong-Ho Lee et al., Samsung Mobile Display Co., Ltd.
U.S. Appl. No. 12/836,760, filed Jul. 15, 2010, Jong-Heon Kim, et al., Samsung Mobile Display Co., Ltd.
U.S. Appl. No. 12/784,804, filed May 21, 2010, Choong-Ho Lee, et al., Samsung Mobile Display Co., Ltd.
U.S. Appl. No. 12/849,193, filed Aug. 3, 2010, Ji-Sook Oh et al., Samsung Mobile Display Co., Ltd.
U.S. Appl. No. 12/979,193, filed Dec. 28, 2010, Hyun Sook Park et al., Samsung Mobile Display Co., Ltd.
U.S. Appl. No. 12/820,355, filed Jun. 22, 2010, Yong-Sup Choi et al., Samsung Mobile Display Co., Ltd.
U.S. Appl. No. 12/950,361, filed Nov. 19, 2010, Choong-Ho Lee, et al., Samsung Mobile Display Co., Ltd.
U.S. Appl. No. 12/795,896, filed Jun. 8, 2010, Jung-Min Lee, et al., Samsung Mobile Display Co., Ltd.
U.S. Appl. No. 12/856,942, filed Aug. 16, 2010, Yun-Mi Lee et al., Samsung Mobile Display Co., Ltd.
U.S. Appl. No. 12/814,816, filed Jun. 14, 2010, Jung-Min Lee et al., Samsung Mobile Display Co., Ltd.
U.S. Appl. No. 12/868,099, filed Aug. 25, 2010, Hee-Cheol Kang, et al., Samsung Mobile Display Co., Ltd.
U.S. Appl. No. 12/862,153, filed Aug. 24, 2010, Hee-Cheol Kang, et al., Samsung Mobile Display Co., Ltd.
U.S. Appl. No. 12/869,830, filed Aug. 27, 2010, Chang-Mog Jo, et al., Samsung Mobile Display Co., Ltd.
U.S. Appl. No. 12/849,092, filed Aug. 3, 2010, Choong-Ho Lee et al., Samsung Mobile Display Co., Ltd.
U.S. Appl. No. 12/873,556, filed Sep. 1, 2010, Young-Mook Choi, et al., Samsung Mobile Display Co., Ltd.
U.S. Appl. No. 12/873,689, filed Sep. 1, 2010, Young-Mook Choi, et al., Samsung Mobile Display Co., Ltd.
U.S. Appl. No. 12/815,673, filed Jun. 15, 2010, Jung-Min Lee, Samsung Mobile Display Co., Ltd.
U.S. Appl. No. 12/794,093, filed Jun. 4, 2010, Jung-Min Lee et al., Samsung Mobile Display Co., Ltd.
U.S. Appl. No. 12/862,125, filed Aug. 24, 2010, Jae-Kwang Ryu et al., Samsung Mobile Display Co., Ltd.
U.S. Appl. No. 12/795,001, filed Jun. 7, 2010, Choong-Ho Lee et al., Samsung Mobile Display Co., Ltd.
U.S. Appl. No. 12/813,786, filed Jun. 11, 2010, Choong-Ho Lee et al., Samsung Mobile Display Co., Ltd.
U.S. Appl. No. 12/820,270, filed Jun. 22, 2010, Jung-Min Lee et al., Samsung Mobile Display Co., Ltd.
U.S. Appl. No. 12/907,396, filed Oct. 19, 2010, Yong-Sup Choi, et al., Samsung Mobile Display Co., Ltd.

(56) References Cited

OTHER PUBLICATIONS

U.S. Appl. No. 12/984,289, filed Jan. 4, 2011, Jung-Yeong Kim et al., Samsung Mobile Display Co., Ltd.
U.S. Appl. No. 13/031,756, filed Feb. 22, 2011, Yong Sup Choi et al., Samsung Mobile Display Co., Ltd.
KIPO Office action dated Sep. 1, 2012, for Korean Patent application 10-2010-0010136, (5 pages).
KIPO Notice of Allowance dated Sep. 1, 2012, for Korean Patent application 10-2010-0013848, (5 pages).
KIPO Notice of Allowance dated Sep. 1, 2012, for Korean Patent application 10-2010-0009160, (5 pages).
Japanese Office action dated Sep. 4, 2012, for Japanese Patent application 2010-152846, (4 pages).
Japanese Office action dated Aug. 21, 2012, for Japanese Patent application 2010-145075, (5 pages).
European Search Report dated May 13, 2011 for European Application No. 11250019.4 (6 pages).
European Search Report dated May 20, 2011 for European Application No. 10251404.9 (12 pages).
European Search Report dated May 27, 2011 for European Application No. 10251514.5 (11 pages).
European Search Report dated Sep. 6, 2010 for European Application No. 10250962.7 (5 pages).
Japanese Patent Office Action dated Jan. 22, 2013 for Japanese Application No. 2010-116470, (3 pages).
Japanese Patent Office Action dated Jan. 8, 2013 for Japanese Application No. 2011-000180 (3 pages).
Japanese Patent Office Action dated Mar. 19, 2013 for Japanese Application No. 2011-097909, (3 pages).
JPO Office action dated Apr. 1, 2014, for Japanese Patent application 2010-286245 (4 pages).
JPO Office action dated Feb. 25, 2014, for corresponding Japanese Patent application 2013-128405 (3 pages).
JPO Office action dated Jan. 28, 2014, for corresponding Japanese Patent application 2011-097909 (4 pages).
KIPO Notice of Allowance dated Apr. 26, 2012 for Korean Application No. 10-2010-0066991 (5 pages).
KIPO Notice of Allowance dated Aug. 24, 2012, issued to KR 10-2010-0066993 (5 pages).
KIPO Notice of Allowance dated Oct. 27, 2011 for Korean Application No. 10-2010-0002381 (5 pages).
KIPO Notice of Allowance dated Oct. 31, 2011, for Korean Patent application 10-2010-0014273, (5 pages).
KIPO Notice of Allowance dated Sep. 1, 2012, for Korean Patent application 10-2010-0013847 (5 pages).
KIPO Notice of Allowance dated Sep. 23, 2011 for Korean Application No. 10-2009-0055473 (5 pages).
KIPO Notice of Allowance dated Sep. 28, 2011 for Korean Application No. 10-2009-0045201 (5 pages).
KIPO Notice of Allowance dated Sep. 28, 2011 for Korean Application No. 10-2009-0052359 (5 pages).
KIPO Notice of Allowance, dated Sep. 1, 2012, issued to KR 10-2010-0014276 (5 pages).
KIPO Office action dated Apr. 2, 2012, issued to KR 10-2010-0066993 (4 pages).
KIPO Office action dated Apr. 4, 2012, issued in KR Application No. 10-2009-0112796 (5 pages).
KIPO Office Action dated Apr. 9, 2012 for Korean Application No. 10-2010-0031556 (4 pages).
KIPO Office action dated Aug. 1, 2011, issued to KR 10-2009-0074001 (3 pages).
KIPO Office Action dated Aug. 28, 2012, issued to KR 10-2010-0014274 (5 pages).
KIPO Office action dated Feb. 1, 2012, for Korean Patent application 10-2010-0013847 (5 pages).
KIPO Office action dated Feb. 1, 2012, issued to KR 10-2010-0014272 (4 pages).
KIPO Office Action dated Feb. 6, 2012 for Korean Application No. 10-2010-0011480 (8 pages).
KIPO Office Action dated Feb. 6, 2012 for Korean Application No. 10-2010-0011481 (7 pages).
KIPO Office Action dated Feb. 6, 2012, issued to KR 10-2010-0014274 (9 pages).
KIPO Office Action dated Feb. 6, 2012, issued to KR 10-2010-0021835 (4 pages).
KIPO Office action dated Jan. 6, 2013, issued to KP Application No. 10-2010-0000897 (4 pages).
KIPO Office action dated Jul. 1, 2011, issued to KR Application No. 10-2009-0072111 (4 pages).
KIPO Office action dated Jun. 1, 2011, issued to KR Application No. 10-2009-0050528 (4 pages).
KIPO Office action dated Mar. 21, 2012, issued to KR Application No. 10-2010-0065465 (5 pages).
KIPO Registration Determination Certificate dated Jul. 2, 2012, for Korean Application No. 10-2010-0011480 (5 pages).
KIPO Registration Determination Certificate dated Jul. 2, 2012, for Korean Application No. 10-2010-0011481 (5 pages).
KIPO Registration Determination Certificate dated Nov. 30, 2011, for Korean Patent application 10-2009-0056530 (5 pages).
KIPO Registration Determination Certificate, dated Jul. 20, 2012, issued to KR Application No. 10-2010-0000897 (5 pages).
Korean Registration Certificate dated Sep. 28, 2011 for Korean Application No. 10-2009-0045200 (5 pages).
SIPO Certificate of Patent dated Aug. 14, 2013, for Chinese application 20100266406.6, (36 pages).
SIPO Certificate of Patent dated Jul. 31, 2013, corresponding to Chinese Patent application 201110029291.3, (31 pages).
SIPO Office action dated Dec. 17, 2013, for Chinese Patent application 201010216896.9 (6 pages).
SIPO Office action dated Feb. 14, 2014, for corresponding Chinese Patent application 201010189614.0 (16 pages).
SIPO Office action dated Mar. 11, 2014, for corresponding Chinese Patent application 201010189581.X (9 pages).
SIPO Office Action dated May 29, 2013, for Chinese Application No. 201010189614.0 (12 pages).
SIPO Office Action dated Nov. 28, 2012 for Chinese Application No. 201110029291.3 (11 pages).
SIPO Office Action dated Oct. 9, 2012 for Chinese Application No. 201010266406.6 (6 pages).
Taiwanese Office action dated Apr. 14, 2014, for Taiwanese Patent application 100114360 (20 pages).
Taiwanese Office action dated Dec. 20, 2013, for Taiwanese Patent application 099116077 (8 pages).
U.S. Interview Summary dated Mar. 11, 2014 for U.S. Appl. No. 12/813,786 (4 pages).
U.S. Office action dated Apr. 1, 2013, issued to U.S. Appl. No. 12/784,774 (44 pages).
U.S. Office action dated Apr. 29, 2013, issued to U.S. Appl. No. 12/820,355 (31 pages).
U.S. Office action dated Aug. 13, 2013, issued to U.S. Appl. No. 13/194,759, (28 pages).
U.S. Office Action dated Aug. 2, 2013 for U.S. Appl. No. 12/868,099 (32 pages).
U.S. Office action dated Aug. 21, 2013 issued in cross-reference U.S. Appl. No. 12/820,355 (14 pages).
U.S. Office action dated Aug. 7, 2013, issued to U.S. Appl. No. 13/015,357, (30 pages).
U.S. Office action dated Aug. 8, 2013, for cross reference U.S. Appl. No. 13/093,707, (7 pages).
U.S. Office Action dated Dec. 13, 2011 for U.S. Appl. No. 12/849,193 (30 pages).
U.S. Office action dated Dec. 16, 2013 for U.S. Appl. No. 14/054,536 (35 pages).
U.S. Office action dated Dec. 17, 2012, issued to U.S. Appl. No. 12/873,556 (37 pages).
U.S. Office action dated Dec. 26, 2012, issued to U.S. Appl. No. 12/815,673 (21 pages).
U.S. Office action dated Feb. 11, 2014, for cross reference U.S. Appl. No. 13/178,472 (8 pages).
U.S. Office action dated Feb. 26, 2013, issued to U.S. Appl. No. 12/794,093 (31 pages).

(56) References Cited

OTHER PUBLICATIONS

U.S. Office action dated Feb. 6, 2014, for U.S. Appl. No. 12/984,231 (16 pages).
U.S. Office action dated Jan. 25, 2013, issued to U.S. Appl. No. 13/015,357 (21 pages).
U.S. Office action dated Jul. 11, 2013 for U.S. Appl. No. 13/461,669 (27 pages).
U.S. Office action dated Jul. 17, 2013, issued to U.S. Appl. No. 12/984,231, (18 pages).
U.S. Office action dated Jul. 24, 2013, issued to U.S. Appl. No. 12/784,804, (52 pages).
U.S. Office action dated Jul. 3, 2013 in U.S. Appl. No. 12/873,689 (48 pages).
U.S. Office action dated Jul. 5, 2013, issued to U.S. Appl. No. 12/873,556, (17 pages).
U.S. Office Action dated Jun. 11, 2013 for U.S. Appl. No. 12/979,656 (50 pages).
U.S. Office action dated Jun. 11, 2013, issued to U.S. Appl. No. 12/862,125 (37 pages).
U.S. Office action dated Jun. 17, 2013, for cross reference U.S. Appl. No. 13/180,454, (23 pages).
U.S. Office Action dated Jun. 21, 2011 for U.S. Appl. No. 12/862,153 (21 pages).
U.S. Office action dated Jun. 26, 2013, issued to U.S. Appl. No. 12/794,093 (20 pages).
U.S. Office action dated Mar. 15, 2013, issued to U.S. Appl. No. 12/813,786 (33 pages).
U.S. Office action dated Mar. 17, 2014, for U.S. Appl. No. 12/950,361 (48 pages).
U.S. Office action dated Mar. 18, 2013, issued to U.S. Appl. No. 12/984,231 (29 pages).
U.S. Office action dated Mar. 19, 2013, issued to U.S. Appl. No. 13/194,759 (36 pages).
U.S. Office Action dated Mar. 23, 2012 for U.S. Appl. No. 12/849,193 (17 pages).
U.S. Office action dated May 22, 2013, for cross reference U.S. Appl. No. 13/219,427, (26 pages).
U.S. Office action dated May 24, 2013, for U.S. Appl. No. 13/279,077 (20 pages).
U.S. Office action dated May 24, 2013, issued to U.S. Appl. No. 12/849,092 (31 pages).
U.S. Office Action dated May 7, 2013, issued in U.S. Appl. No. 12/820,270 (37 pages).
U.S. Office action dated Nov. 20, 2013, for cross reference U.S. Appl. No. 12/868,099, (14 pages).
U.S. Office action dated Nov. 22, 2013, issued to U.S. Appl. No. 13/198,591, (28 pages).
U.S. Office action dated Nov. 25, 2013, issued to U.S. Appl. No. 13/176,701, (49 pages).
U.S. Office action dated Nov. 4, 2013, for U.S. Appl. No. 13/219,427, (26 pages).
U.S. Office action dated Oct. 1, 2013, issued to U.S. Appl. No. 12/849,092, (13 pages).
U.S. Office action dated Oct. 11, 2013, issued to U.S. Appl. No. 12/907,396, (44 pages).
U.S. Office Action dated Oct. 3, 2012 for U.S. Appl. No. 12/869,830 (28 pages).
U.S. Office action dated Oct. 7, 2013, issued to U.S. Appl. No. 13/279,077, (29 pages).
U.S. Office action dated Sep. 20, 2013, issued to U.S. Appl. No. 13/014,225, (33 pages).
U.S. Office action dated Sep. 25, 2013, for U.S. Appl. No. 13/031,756, (34 pages).
U.S. Patent Office Action dated May 16, 2013, issued to U.S. Appl. No. 13/235,337 (28 pages).
US Notice of Allowance, dated Mar. 18, 2013, issued to U.S. Appl. No. 12/795,001 (29 pages).
US Office action dated Dec. 20, 2012, issued to U.S. Appl. No. 12/984,289 (20 pages).
US Office action dated Sep. 12, 2012, in U.S. Appl. No. 12/815,673 (26 pages).

\* cited by examiner

THIN FILM DEPOSITION APPARATUS, METHOD OF MANUFACTURING ORGANIC LIGHT-EMITTING DISPLAY DEVICE BY USING THE APPARATUS, AND ORGANIC LIGHT-EMITTING DISPLAY DEVICE MANUFACTURED BY USING THE METHOD

CROSS-REFERENCE TO RELATED APPLICATION

This application claims the benefit of Korean Patent Application No. 10-2010-0003545, filed on Jan. 14, 2010, in the Korean Intellectual Property Office, the disclosure of which is incorporated herein by reference.

BACKGROUND

1. Field

An aspect of the present invention relates to a thin film deposition apparatus, a method of manufacturing an organic light-emitting display device by using the thin film deposition apparatus, and an organic light-emitting display device manufactured by using the method. More particularly, an aspect of the present invention relates to a thin film deposition apparatus that is suitable for manufacturing large-sized display devices on a mass scale with a high yield, a method of manufacturing an organic light-emitting display device by using the thin film deposition apparatus, and an organic light-emitting display device manufactured by using the method.

2. Description of the Related Art

Organic light-emitting display devices have a larger viewing angle, better contrast characteristics, and a faster response rate than other display devices, and thus have drawn attention as a next-generation display device.

Organic light-emitting display devices generally have a stacked structure including an anode, a cathode, and an emission layer interposed between the anode and the cathode. The devices display images in color when holes and electrons, injected respectively from the anode and the cathode, recombine in the emission layer and thus emit light. However, it is difficult to achieve high light-emission efficiency with such a structure, and thus intermediate layers, including an electron injection layer, an electron transport layer, a hole transport layer, a hole injection layer, or the like, are optionally additionally interposed between the emission layer and each of the electrodes.

Also, it is practically very difficult to form fine patterns in organic thin films such as the emission layer and the intermediate layers, and red, green, and blue light-emission efficiency varies according to the organic thin films. For these reasons, it is not easy to form an organic thin film pattern on a large substrate, such as a mother glass having a size of 5G or more, by using a conventional thin film deposition apparatus, and thus it is difficult to manufacture large organic light-emitting display devices having satisfactory driving voltage, current density, brightness, color purity, light-emission efficiency, life-span characteristics. Thus, there is a demand for improvement in this regard.

An organic light-emitting display device includes intermediate layers, including an emission layer disposed between a first electrode and a second electrode that are arranged opposite to each other. The interlayer and the first and second electrodes may be formed using a variety of methods one of which is a deposition method. When an organic light-emitting display device is manufactured by using the deposition method, a fine metal mask (FMM) having the same pattern as a thin film to be formed is disposed to closely contact a substrate, and a thin film material is deposited over the FMM in order to form the thin film having the desired pattern.

SUMMARY

Aspects of the present invention provide a thin film deposition apparatus that may be easily manufactured, that may be easily used to manufacture large-sized display devices on a mass scale, that improves manufacturing yield and deposition efficiency, a method of manufacturing an organic light-emitting display device by using the thin film deposition apparatus, and an organic light-emitting display device manufactured by using the method.

According to an aspect of the present invention, there is provided a thin film deposition apparatus for forming a thin film on a substrate, the apparatus including: a deposition source that discharges a deposition material; a deposition source nozzle unit disposed at a side of the deposition source and including a plurality of deposition source nozzles arranged in a first direction; a patterning slit sheet disposed opposite to the deposition source nozzle unit and including a plurality of patterning slits having different lengths arranged in the first direction; and a barrier plate assembly disposed between the deposition source nozzle unit and the patterning slit sheet in the first direction, and including a plurality of barrier plates that partition a space between the deposition source nozzle unit and the patterning slit sheet into a plurality of sub-deposition spaces, wherein the thin film deposition apparatus is separated from the substrate by a predetermined distance, and the thin film deposition apparatus and the substrate are movable relative to each other.

The patterning slits may include first patterning slits having a first length and second patterning slits having a second length that is different from the first length.

The first patterning slits and the second patterning slits may be alternately disposed.

The first patterning slits may be formed so as to correspond to a red sub-pixel region, and the second patterning slits are formed so as to correspond to a green sub-pixel region, wherein the first patterning slits are longer than the second patterning slits.

The pattering slits may not be formed in a region of the patterning slit sheet corresponding to a blue sub-pixel region.

The amounts of the deposition materials deposited on the substrate may be controlled according to the lengths of the patterning slits.

The deposition materials discharged from the deposition source may simultaneously be deposited on the red sub-pixel region and the green sub-pixel region.

The thickness of the deposition material deposited on the red sub-pixel region may be greater than that of the deposition material deposited on the green sub-pixel region.

Each of the barrier plates may extend in a second direction that is substantially perpendicular to the first direction, in order to partition the space between the deposition source nozzle unit and the patterning slit sheet into the plurality of sub-deposition spaces.

The plurality of barrier plates may be arranged at equal intervals.

Each of the barrier plate assemblies may include a first barrier plate assembly including a plurality of first barrier plates, and a second barrier plate assembly including a plurality of second barrier plates.

Each of the first barrier plates and each of the second barrier plates may extend in a second direction that is substantially perpendicular to the first direction, in order to partition the space between the deposition source nozzle unit and the patterning slit sheet into the plurality of sub-deposition spaces.

The first barrier plates may be arranged to respectively correspond to the second barrier plates.

Each pair of the corresponding first and second barrier plates may be arranged on substantially the same plane.

The thin film deposition apparatus may include a plurality of thin film deposition assemblies, wherein each of the thin film deposition assemblies includes the deposition source, the deposition source nozzle unit, the patterning slit sheet, and the barrier plate assembly.

The deposition sources of the plurality of thin film deposition assemblies may respectively contain different deposition materials.

The deposition materials respectively contained in the deposition sources of the plurality of thin film deposition assemblies may be simultaneously deposited on the substrate.

The number of thin film deposition assemblies may be at least four, and deposition materials respectively contained in the deposition sources of the at least four thin film deposition assemblies may include materials for forming auxiliary layers and red, green and blue emission layers.

Deposition temperatures of the deposition sources of the plurality of thin film deposition assemblies may be separately controllable.

The deposition material discharged from the thin film deposition apparatus may continuously be deposited on the substrate while the substrate is moved relative to the thin film deposition apparatus.

The thin film deposition apparatus or the substrate may be movable relative to each other along a plane parallel to a surface of the substrate on which the deposition materials are deposited.

The patterning slit sheets of the plurality of thin film deposition assemblies may be smaller than the substrate.

The barrier plate assemblies may guide the deposition materials discharged from the deposition sources.

According to another aspect of the present invention, there is provided a thin film deposition apparatus for forming a thin film on a substrate, the apparatus including: a deposition source that discharges a deposition material; a deposition source nozzle unit disposed at a side of the deposition source and including a plurality of deposition source nozzles arranged in a first direction; and a patterning slit sheet disposed opposite to the deposition source nozzle unit and including a plurality of patterning slits having different lengths arranged in a second direction perpendicular to the first direction, wherein a deposition is performed while the substrate moves relative to the thin film deposition apparatus in the first direction, and the deposition source, the deposition source nozzle unit, and the patterning slit sheet are formed integrally with each other.

The patterning slits may include first patterning slits having a first length and second patterning slits having a second length that is different from the first length.

The first patterning slits and the second patterning slits may alternatingly be disposed.

The first patterning slits may be formed so as to correspond to a red sub-pixel region, and the second patterning slits may be formed so as to correspond to a green sub-pixel region, wherein the first patterning slits are longer than the second patterning slits.

Pattering slits may not be formed in a region of the patterning slit sheet corresponding to a blue sub-pixel region.

The amounts of the deposition materials deposited on the substrate may be controlled according to the lengths of the patterning slits.

The deposition materials discharged from the deposition source may simultaneously be deposited on the red sub-pixel region and the green sub-pixel region.

The thickness of the deposition material deposited on the red sub-pixel region may be greater than that of the deposition material deposited on the green sub-pixel region.

The deposition source and the deposition source nozzle unit, and the patterning slit sheet may be connected to each other by a connection member.

The connection member may guide movement of the discharged deposition material.

The connection member may seal a space between the deposition source and the deposition source nozzle unit, and the patterning slit sheet.

The thin film deposition apparatus may be separated from the substrate by a predetermined distance.

The deposition material discharged from the thin film deposition apparatus may continuously be deposited on the substrate while the substrate is moved relative to the thin film deposition apparatus in the first direction.

The patterning slit sheet of the thin film deposition apparatus may be smaller than the substrate.

The thin film deposition apparatus may include a plurality of thin film deposition assemblies, wherein each of the thin film deposition apparatus includes the deposition source, the deposition source nozzle unit, the patterning slit sheet, and the barrier plate assembly.

The deposition sources of the plurality of thin film deposition assemblies may respectively contain different deposition materials.

The deposition materials respectively contained in the deposition sources of the plurality of thin film deposition assemblies may simultaneously be deposited on the substrate.

The number of thin film deposition assemblies may be at least four, and deposition materials respectively contained in the deposition sources of the at least four thin film deposition assemblies may include materials for forming auxiliary layers and red, green and blue emission layers.

Deposition temperatures of the deposition sources of the plurality of thin film deposition assemblies may be separately controllable.

According to another aspect of the present invention, there is provided a method of manufacturing an organic light-emitting display device, the method including: separating a thin film deposition assembly from a substrate that is fixedly supported by a chuck and performing deposition on the substrate while the thin film deposition assembly or the substrate fixedly supported by the chuck is moved relative to each other, wherein the thin film deposition apparatus includes a deposition source that discharges a deposition material, a deposition source nozzle unit disposed at a side of the deposition source and including a plurality of deposition source nozzles arranged in a first direction, a patterning slit sheet disposed opposite to the deposition source nozzle unit and including a plurality of patterning slits having different lengths arranged in the first direction, and a barrier plate assembly disposed between the deposition source nozzle unit and the patterning slit sheet in the first direction, and including a plurality of barrier plates that partition a space between the deposition source nozzle unit and the patterning slit sheet into a plurality of sub-deposition spaces.

According to another aspect of the present invention, there is provided a method of manufacturing an organic light-emitting display device, the method including: separating a thin film deposition assembly from a substrate that is fixedly supported by a chuck and performing deposition on the substrate while the thin film deposition assembly or the substrate fixedly supported by the chuck is moved relative to each other, wherein the thin film deposition apparatus includes a deposition source that discharges a deposition material, a deposition source nozzle unit disposed at a side of the deposition source and including a plurality of deposition source nozzles arranged in a first direction, and a patterning slit sheet disposed opposite to the deposition source nozzle unit and including a plurality of patterning slits having different lengths arranged in a second direction perpendicular to the first direction.

The deposition materials may include organic materials, and auxiliary layers having different thicknesses formed in the red, green, and blue sub-pixels which respectively emit red, green, and blue light by the thin film deposition apparatus.

According to another aspect of the present invention, there is provided an organic light-emitting display device manufactured using the method.

Additional aspects and/or advantages of the invention will be set forth in part in the description which follows and, in part, will be obvious from the description, or may be learned by practice of the invention.

BRIEF DESCRIPTION OF THE DRAWINGS

These and/or other aspects and advantages of the invention will become apparent and more readily appreciated from the following description of the embodiments, taken in conjunction with the accompanying drawings of which.

DETAILED DESCRIPTION

Figure 1:
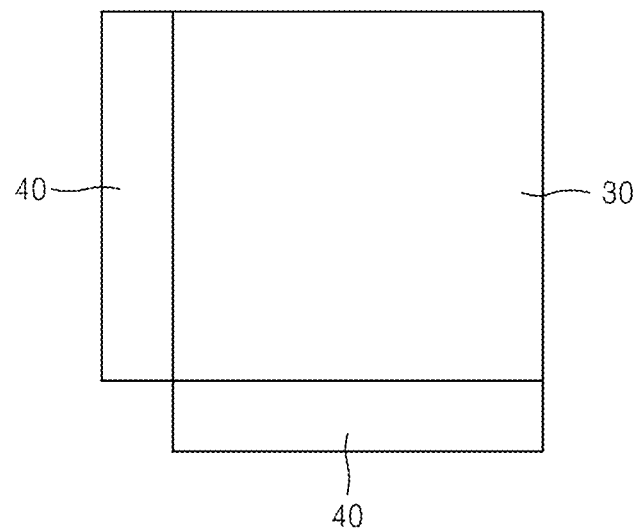
FIG. 1 is a plan view of an organic light-emitting display device manufactured by using a thin film deposition apparatus according to an embodiment of the present invention.

Reference will now be made in detail to the present embodiments of the present invention, examples of which are illustrated in the accompanying drawings, wherein like reference numerals refer to the like elements throughout. The embodiments are described below in order to explain the present invention by referring to the figures. Moreover, it is to be understood that where is stated herein that one film or layer is "formed on" or "disposed on" a second layer or film, the first layer or film may be formed or disposed directly on the second layer or film or there may be intervening layers or films between the first layer or film and the second layer or film. Further, as used herein, the term "formed on" is used with the same meaning as "located on" or "disposed on" and is not meant to be limiting regarding any particular fabrication process.

FIG. 1 is a plan view of an organic light-emitting display device manufactured by using a thin film deposition apparatus, according to an embodiment of the present invention.

Referring to FIG. 1, the organic light-emitting display device includes a pixel region 30 and circuit regions 40 disposed at edges of the pixel region 30. The pixel region 30 includes a plurality of pixels, and each of the pixels includes an emission unit that emits light to display an image.

In an embodiment of the present invention, the emission unit may include a plurality of sub-pixels, each of which includes an organic light-emitting diode (OLED). In a full-color organic light-emitting display device, red (R), green (G) and blue (B) sub-pixels are arranged in various patterns, for example, in a line, mosaic, or lattice pattern, to constitute a pixel. The organic light-emitting display device may include a monochromatic flat display device. However, it is understood that the organic light-emitting display device may include other flat display devices.

The circuit regions 40 control, for example, an image signal that is input to the pixel region 30. In the organic light-emitting display device, at least one thin film transistor (TFT) may be installed in each of the pixel region 30 and the circuit region 40.

The at least one TFT installed in the pixel region 30 may include a pixel TFT, such as a switching TFT that transmits a data signal to an OLED according to a gate line signal to control the operation of the OLED, and a driving TFT that drives the OLED by supplying current according to the data signal. The at least one TFT installed in the circuit region 40 may include a circuit TFT constituted to implement a predetermined circuit.

The number and arrangement of TFTs may vary according to the features of the display device and the driving method thereof.

Figure 2:
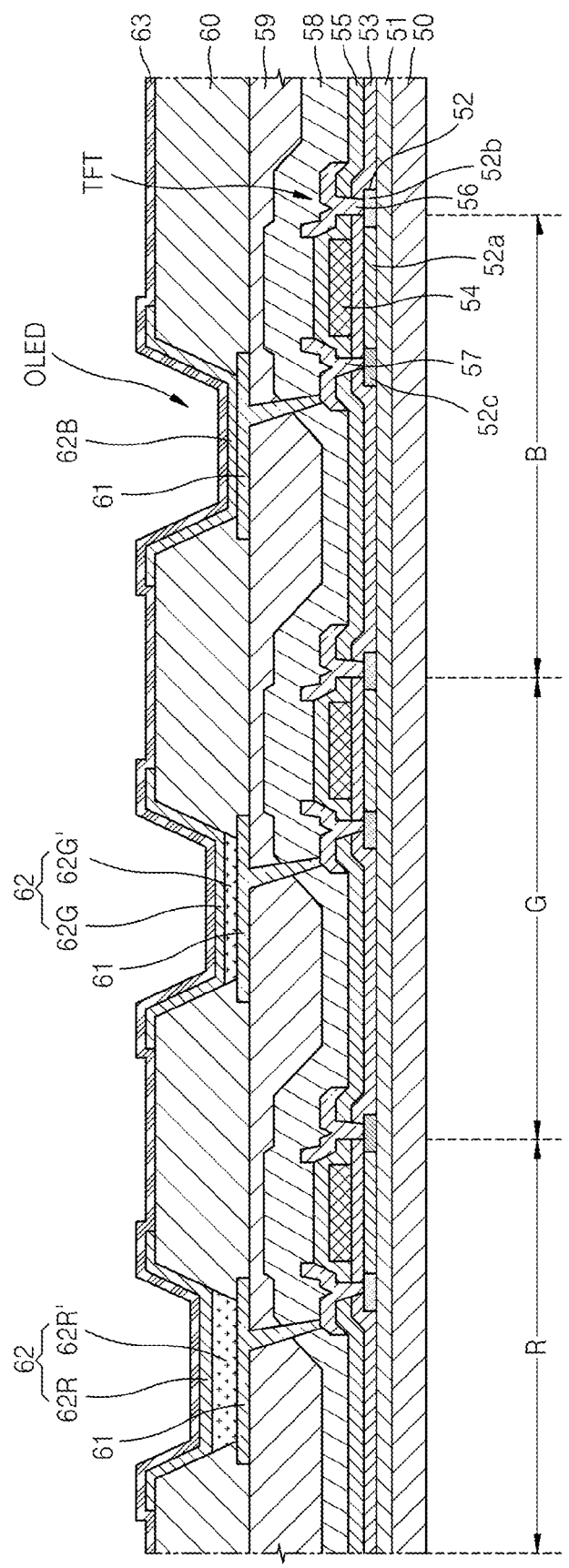
FIG. 2 is a sectional view of a pixel of the organic light-emitting display device illustrated in FIG. 1.

FIG. 2 is a sectional view of a pixel of the organic light-emitting display device illustrated in FIG. 1.

Referring to FIG. 2, a buffer layer 51 is formed on a substrate 50 formed of glass or plastic. A TFT and an OLED are formed on the buffer layer 51.

An active layer 52 having a predetermined pattern is formed on the buffer layer 51. A gate insulating layer 53 is formed on the active layer 52, and a gate electrode 54 is formed in a predetermined region of the gate insulating layer 53. The gate electrode 54 is connected to a gate line (not shown) that applies a TFT ON/OFF signal. An interlayer insulating layer 55 is formed on the gate electrode 54. Source/drain electrodes 56 and 57 are formed such as to contact source/drain regions 52b and 52c, respectively, of the active layer 52 through contact holes. A passivation layer 58 is formed of $SiO_2$, $SiN_x$, or the like, on the source/drain electrodes 56 and 57. A planarization layer 59 is formed of an organic material, such as acryl, polyimide, benzocyclobutene (BCB), or the like, on the passivation layer 58. A first electrode 61, which functions as an anode of the OLED, is formed on the planarization layer 59, and a pixel defining layer 60 formed of an organic material is formed to cover the first electrode 61. An opening is formed in the pixel defining layer 60, and an organic layer 62 is formed on a surface of the pixel defining layer 60 and on a surface of the first electrode 61 exposed through the opening. The organic layer 62 includes an emission layer. The aspects of the present invention are not limited to the structure of the organic light-emitting display device described above, and various structures of organic light-emitting display devices may be applied to the aspects of the present invention.

The OLED displays predetermined image information by emitting red, green and blue light as current flows. The OLED includes the first electrode 61, which is connected to the drain electrode 56 of the TFT and to which a positive power voltage is applied, a second electrode 63, which is formed so as to cover the entire pixel and to which a negative power voltage is applied, and the organic layer 62, which is disposed between the first electrode 61 and the second electrode 63 to emit light.

The first electrode 61 and the second electrode 63 are insulated from each other by the organic layer 62, and respectively apply voltages of opposite polarities to the organic layer 62 to induce light emission in the organic layer 62.

The organic layer 62 may be formed of a low-molecular weight organic material or a high-molecular weight organic material. When a low-molecular weight organic material is used, the organic layer 62 may have a single or multi-layer structure including at least one selected from the group consisting of a hole injection layer (HIL), a hole transport layer (HTL), an emission layer (EML), an electron transport layer (ETL), and an electron injection layer (EIL). Examples of available organic materials may include copper phthalocyanine (CuPc), N,N'-di(naphthalene-1-yl)-N,N'-diphenyl-benzidine (NPB), tris-8-hydroxyquinoline aluminum (Alq3), and the like. The low-molecular weight organic layer may be formed by vacuum deposition.

When a high-molecular weight organic layer is used as the organic layer 62, the organic layer 62 may mostly have a structure including a HTL and an EML. In this case, the HTL may be formed of poly(ethylenedioxythiophene) (PEDOT), and the EML may be formed of polyphenylenevinylenes (PPVs) or polyfluorenes. The HTL and the EML may be formed by screen printing, inkjet printing, or the like.

The organic layer 62 is not limited to the organic layers described above, and may be embodied in various ways.

The first electrode 61 may function as an anode, and the second electrode 63 may function as a cathode. Alternatively, the first electrode 61 may function as a cathode, and the second electrode 63 may function as an anode.

The first electrode 61 may be formed as a transparent electrode or a reflective electrode. Such a transparent electrode may be formed of indium tin oxide (ITO), indium zinc oxide (IZO), zinc oxide (ZnO), or indium oxide (In$_2$O$_3$). Such a reflective electrode may be formed by forming a reflective layer from silver (Ag), magnesium (Mg), aluminum (Al), platinum (Pt), palladium (Pd), gold (Au), nickel (Ni), neodymium (Nd), iridium (Ir), chromium (Cr) or a compound thereof and forming a layer of ITO, IZO, ZnO, or In$_2$O$_3$ on the reflective layer.

The second electrode 63 may be formed as a transparent electrode or a reflective electrode. When the second electrode 63 is formed as a transparent electrode, the second electrode 63 functions as a cathode. To this end, such a transparent electrode may be formed by depositing a metal having a low work function, such as lithium (Li), calcium (Ca), lithium fluoride/calcium (LiF/Ca), lithium fluoride/aluminum (LiF/Al), aluminum (Al), silver (Ag), magnesium (Mg), or a compound thereof on a surface of the organic layer 62 and forming an auxiliary electrode layer or a bus electrode line thereon from a transparent electrode forming material, such as ITO, IZO, ZnO, In$_2$O$_3$, or the like. When the second electrode 63 is formed as a reflective electrode, the reflective layer may be formed by depositing Li, Ca, LiF/Ca, LiF/Al, Al, Ag, Mg, or a compound thereof on the entire surface of the organic layer 62.

In the organic light-emitting display device described above, the organic layer 62 including the emission layer may be formed by using a thin film deposition assembly 100 (see FIG. 3), which will be described later.

Specifically, the organic layer 62 may include emission layers 62R, 62G, and 62B and auxiliary layers 62R' and 62G'. The emission layers 62R, 62G, 62B may emit red, green, or blue lights based on the material. Meanwhile, the auxiliary layers 62R' and 62G' may be formed of the same material as the HTL.

Meanwhile, one of the first electrode 61 and the second electrode 63 is a reflective electrode and the other is a semi-transparent electrode or a transparent electrode. Thus, resonance may occur between the first electrode 61 and the second electrode 63 while the organic light-emitting display device is driving. Accordingly, while the organic light-emitting display device is driving, light that is generated in emission layers 62R, 62G, and 62B formed between the first electrode 61 and the second electrode 63 resonates between the first electrode 61 and the second electrode 63 to be emitted out of the organic light-emitting display device, so that emitting brightness and emitting efficiency may be improved.

In this regard, in an organic light-emitting display device manufactured using the thin film deposition apparatus, organic layers, including auxiliary layers 62R' and 62G', in R, G, and B sub-pixels, which respectively emit red, green and blue light, may have different thicknesses.

In particular, the auxiliary layer 62R' in the R sub-pixel may have a thickness of about 1600 Å to about 2200 Å. If the thickness of the auxiliary layer 62R' is not within the range defined above, the auxiliary layer 62R' may not have sufficient hole injecting capability and hole transporting capability to induce a resonance effect in the red emission layer 62R. Thus, color purity may deteriorate, and emission efficiency may be reduced. In addition, if the thicknesses of the auxiliary layer 62R' is greater than the upper limit defined above, the driving voltage may be increased.

The auxiliary layer 62G' in the G sub-pixel may have a thickness of about 1000 Å to about 1200 Å. If the thickness of the auxiliary layer 62G' is not within the range defined above, the auxiliary layer 62G' may not have sufficient hole injecting capability and hole transporting capability to induce a resonance effect in the green emission layer 62G. Thus, color purity may be deteriorated, and emission efficiency may be reduced. In addition, if the thickness of the auxiliary layer 62G' is greater than the upper limit defined above, the driving voltage may be increased.

In the organic light-emitting display device, a resonance phenomenon may occur between the first electrode 61 and the second electrode 63 while driving the organic light-emitting display device. In this regard, since the auxiliary layers 62R' and 62G' among the organic layers that are interposed between the first electrode 61 and the second electrode 63 have different thicknesses according to the color of lights emitted in the emission layers 62R, 62G, and 62B as described above, the organic light-emitting display device may have excellent characteristics such as driving voltage, high current density, high brightness, color purity, light-emission efficiency, and life-span characteristics.

Here, the auxiliary layer 62R' of the R sub-pixel that emits red light and the auxiliary layer 62G' of the G sub-pixel that emits green light may be prepared using a single process by using the thin film deposition apparatus, which will be described in detail later.

Hereinafter, a thin film deposition apparatus according to an embodiment of the present invention and a method of manufacturing an organic light-emitting display device by using the thin film deposition apparatus will be described in detail.

Figure 3:
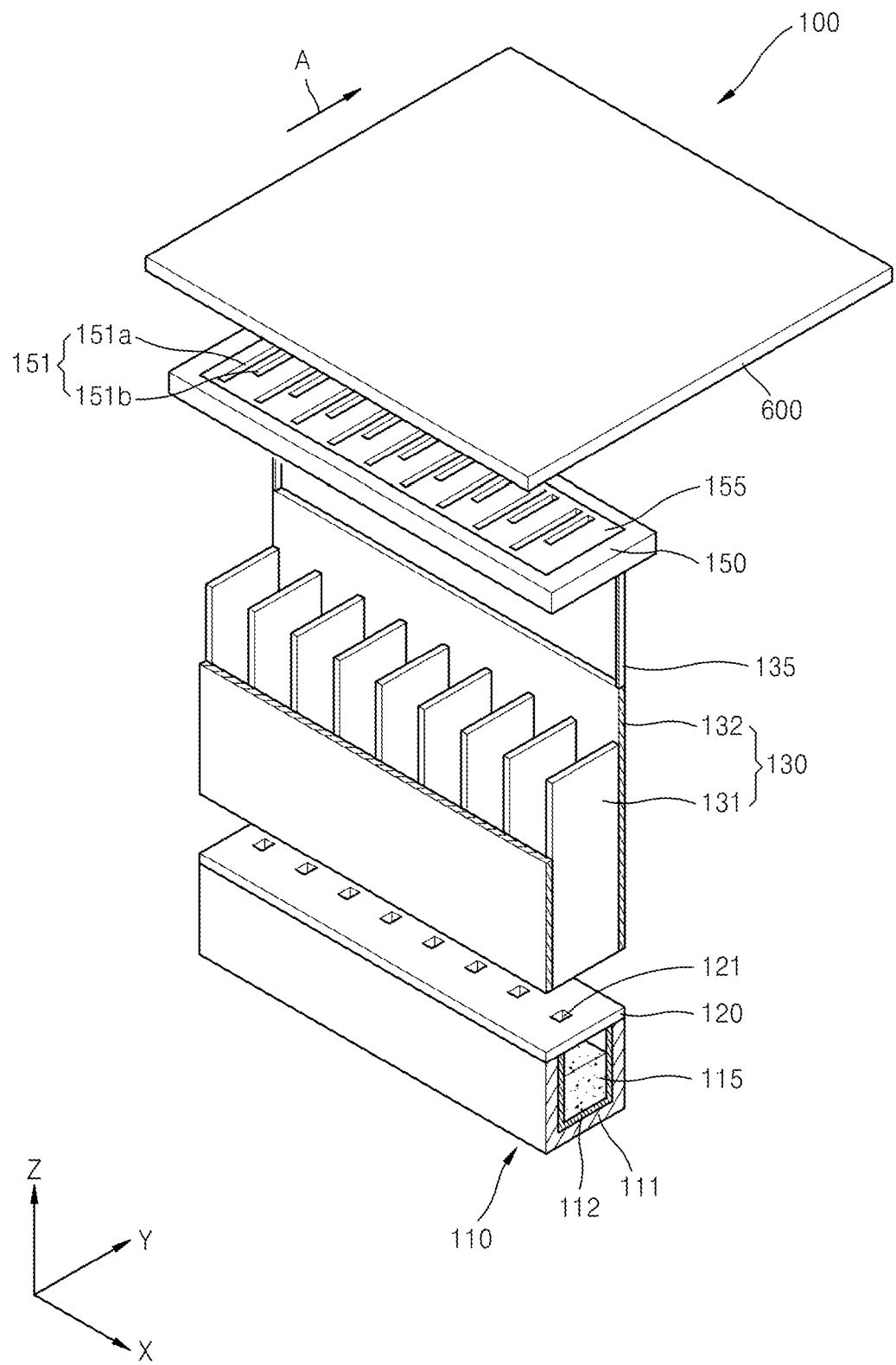
FIG. 3 is a schematic perspective view of a thin film deposition assembly according to an embodiment of the present invention.
Figure 4:
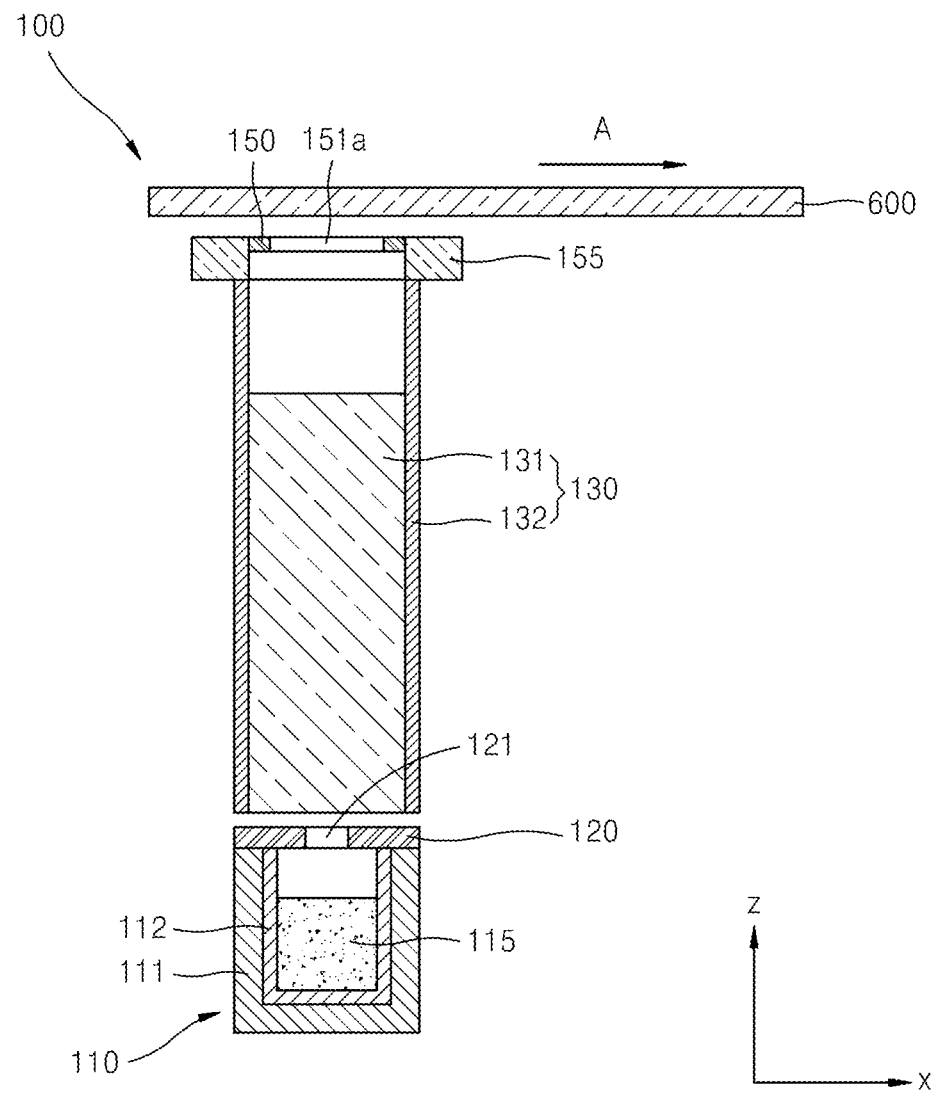
FIG. 4 is a schematic sectional view of the thin film deposition assembly illustrated in FIG. 3.
Figure 5:
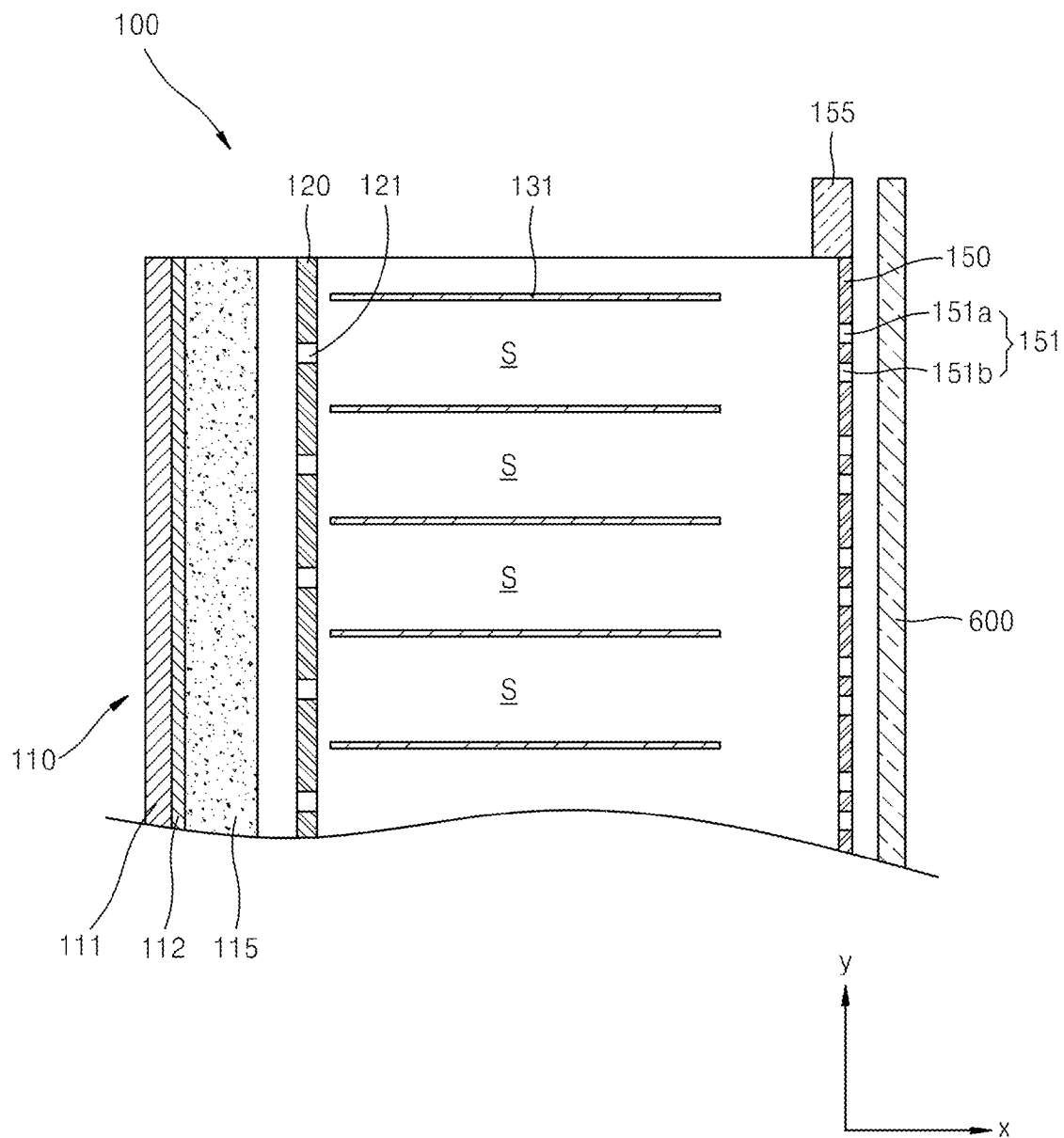
FIG. 5 is a schematic plan view of the thin film deposition assembly illustrated in FIG. 3.

FIG. 3 is a schematic perspective view of a thin film deposition assembly 100 according to an embodiment of the present invention, FIG. 4 is a schematic sectional view of the thin film deposition assembly 100 illustrated in FIG. 3, and FIG. 5 is a schematic plan view of the thin film deposition assembly 100 illustrated in FIG. 3.

Referring to FIGS. 3, 4 and 5, the thin film deposition assembly 100 includes a deposition source 110, a deposition source nozzle unit 120, a barrier plate assembly 130, and a patterning slit sheet 150.

Although a chamber is not illustrated in FIGS. 3, 4 and 5 for convenience of explanation, all the components of the thin film deposition assembly 100 may be disposed within a chamber that is maintained at an appropriate degree of vacuum. The chamber is maintained at an appropriate vacuum in order to allow a deposition material to move in a substantially straight line through the thin film deposition apparatus.

In particular, in order to deposit a deposition material 115 that is emitted from the deposition source 110 and is discharged through the deposition source nozzle unit 120 and the patterning slit sheet 150, onto a substrate 600 in a desired pattern, it is required to maintain the chamber in a high-vacuum state as in a deposition method using a fine metal mask (FMM). In addition, the temperatures of barrier plates 131 and the patterning slit sheet 150 have to be sufficiently lower than the temperature of the deposition source 110. In this regard, the temperatures of the barrier plates 131 and the patterning slit sheet 150 may be about 100° C. or less. This is so the deposition material 115 that has collided against the barrier plates 131 is not re-vaporized. In addition, thermal expansion of the patterning slit sheet 150 may be minimized when the temperature of the patterning slit sheet 150 is sufficiently low. The barrier plate assembly 130 faces the deposition source 110 which is at a high temperature. In addition, the temperature of a portion of the barrier plate assembly 130 close to the deposition source 110 rises by a maximum of about 167° C., and thus a partial-cooling apparatus may be further included if needed. To this end, the barrier plate assembly 130 may include a cooling member.

The substrate 600, which constitutes a target on which a deposition material is to be deposited, is disposed in the chamber. The substrate 600 may be a substrate for flat panel displays. A large substrate, such as a mother glass, for manufacturing a plurality of flat panel displays, may be used as the substrate 160. Other substrates may also be employed.

In an embodiment of the present invention, deposition may be performed while the substrate 600 is moved relative to the thin film deposition assembly 100.

In particular, in the conventional FMM deposition method, the size of the FMM has to be equal to the size of a substrate. Thus, the size of the FMM has to be increased as the substrate becomes larger. However, it is neither straightforward to manufacture a large FMM nor to extend an FMM to be accurately aligned with a pattern.

In order to overcome this problem, in the thin film deposition assembly 100 according to an embodiment of the present invention, deposition may be performed while the thin film deposition assembly 100 or the substrate 600 is moved relative to each other. In other words, deposition may be continuously performed while the substrate 600, which is disposed such as to face the thin film deposition assembly 100, is moved in a Y-axis direction. In other words, deposition is performed in a scanning manner while the substrate 600 is moved in a direction of an arrow A in FIG. 3. Although the substrate 600 is illustrated as being moved in the Y-axis direction in FIG. 3 when deposition is performed, the present invention is not limited thereto. Deposition may also be performed while the thin film deposition assembly 100 is moved in the Y-axis direction, whereas the substrate 600 is fixed.

Thus, in the thin film deposition assembly 100, the patterning slit sheet 150 may be significantly smaller than an FMM used in a conventional deposition method. In other words, in the thin film deposition assembly 100, deposition is continuously performed, i.e., in a scanning manner while the substrate 600 is moved in the Y-axis direction. Thus, lengths of the patterning slit sheet 150 in the X-axis and Y-axis directions may be significantly less than the lengths of the substrate 600 in the X-axis and Y-axis directions. As described above, since the patterning slit sheet 150 may be formed to be significantly smaller than an FMM used in a conventional deposition method, it is relatively easy to manufacture the patterning slit sheet 150. In other words, using the patterning slit sheet 150, which is smaller than an FMM used in a conventional deposition method, is more convenient in all processes, including etching and subsequent other processes, such as precise extension, welding, moving, and cleaning processes, compared to the conventional deposition method using the larger FMM. This is more advantageous for a relatively large display device.

In order to perform deposition while the thin film deposition assembly 100 or the substrate 600 is moved relative to each other as described above, the thin film deposition assembly 100 and the substrate 600 may be separated from each other by a predetermined distance. This will be described later in detail.

The deposition source 110 that contains and heats the deposition material 115 is disposed in an opposite side of the chamber to that in which the substrate 600 is disposed. As the deposition material 115 contained in the deposition source 110 is vaporized, the deposition material 115 is deposited on the substrate 600.

In particular, the deposition source 110 includes a crucible 111 that is filled with the deposition material 115, and a heater 112 that heats the crucible 111 to vaporize the deposition material 115, which is contained in the crucible 111, towards a side of the crucible 111, and in particular, towards the deposition source nozzle unit 120.

The deposition source nozzle unit 120 is disposed at a side of the deposition source 110, and in particular, at the side of the deposition source 110 facing the substrate 600. The deposition source nozzle unit 120 includes a plurality of deposition source nozzles 121 arranged at equal intervals in the X-axis direction. The deposition material 115 that is vaporized in the deposition source 110, passes through the deposition source nozzle unit 120 towards the substrate 600.

The barrier plate assembly 130 is disposed at a side of the deposition source nozzle unit 120. The barrier plate assembly 130 includes a plurality of barrier plates 131, and a barrier plate frame 132 that covers sides of the barrier plates 131. The plurality of barrier plates 131 may be arranged parallel to each other at equal intervals in the X-axis direction. In addition, each of the barrier plates 131 may be arranged parallel to an YZ plane in FIG. 3, i.e., perpendicular to the X-axis direction. The plurality of barrier plates 131 arranged as described above partition the space between the deposition source nozzle unit 120 and the patterning slit sheet 150 into a plurality of sub-deposition spaces S (see FIG. 5). In the thin film deposition assembly 100 according to an embodiment of the present invention, the deposition space is divided by the barrier plates 131 into the sub-deposition spaces S that respectively correspond to the deposition source nozzles 121 through which the deposition material 115 is discharged.

The barrier plates 131 may be respectively disposed between adjacent deposition source nozzles 121. In other words, each of the deposition source nozzles 121 may be disposed between two adjacent barrier plates 131. The deposition source nozzles 121 may be respectively located at the midpoint between two adjacent barrier plates 131. As described above, since the barrier plates 131 partition the space between the deposition source nozzle unit 120 and the patterning slit sheet 150 into the plurality of sub-deposition spaces S, the deposition material 115 discharged through each of the deposition source nozzles 121 is not mixed with the deposition material 115 discharged through the other deposition source nozzles slits 121, and passes through patterning slits 151 so as to be deposited on the substrate 600. In other words, the barrier plates 131 guide the deposition material 115, which is discharged through the deposition source nozzles slits 121, to move straight, not to flow in the X-axis direction.

As described above, the deposition material 115 is forced to move straight by installing the barrier plates 131, so that a smaller shadow zone may be formed on the substrate 600 compared to a case where no barrier plates are installed. Thus, the thin film deposition assembly 100 and the substrate 600 can be separated from each other by a predetermined distance. This will be described later in detail.

The barrier plate frame 132, which forms upper and lower sides of the barrier plates 131, maintains the positions of the barrier plates 131, and guides the deposition material 115, which is discharged through the deposition source nozzles 121, not to flow in the Y-axis direction.

Although the deposition source nozzle unit 120 and the barrier plate assembly 130 are illustrated as being separated from each other by a predetermined distance, the present invention is not limited thereto. In order to prevent the heat emitted from the deposition source 110 from being conducted to the barrier plate assembly 130, the deposition source nozzle unit 120 and the barrier plate assembly 130 may be separated from each other by a predetermined distance. Alternatively, if a heat insulator is disposed between the deposition source nozzle unit 120 and the barrier plate assembly 130, the deposition source nozzle unit 120 and the barrier plate assembly 130 may be bound together with the heat insulator therebetween.

In addition, the barrier plate assembly 130 may be constructed to be detachable from the thin film deposition assembly 100. A conventional FMM deposition method has low deposition efficiency. Deposition efficiency refers to the ratio of a deposition material deposited on a substrate to the deposition material vaporized from a deposition source. The conventional FMM deposition method has a deposition efficiency of about 32%. Furthermore, in the conventional FMM deposition method, about 68% of organic deposition material that is not deposited on the substrate remains adhered to a deposition apparatus, and thus reusing the deposition material is not straightforward.

In order to overcome these problems, in the thin film deposition assembly 100 according to an embodiment of the present invention, the deposition space is enclosed by using the barrier plate assembly 130, so that the deposition material 115 that is not deposited on the substrate 600 is mostly deposited within the barrier plate assembly 130. Thus, since the barrier plate assembly 130 is constructed to be detachable from the thin film deposition assembly 100, when a large amount of the deposition material 115 lies in the barrier plate assembly 130 after a long deposition process, the barrier plate assembly 130 may be detached from the thin film deposition assembly 100 and then placed in a separate deposition material recycling apparatus in order to recover the deposition material 115. Due to the structure of the thin film deposition apparatus, a reuse rate of the deposition material 115 is increased, so that the deposition efficiency is improved, whereas the manufacturing costs are reduced.

The patterning slit sheet 150 and a frame 155 in which the patterning slit sheet 150 is bound are disposed between the deposition source 110 and the substrate 600. The frame 155 may be formed in a lattice shape, similar to a window frame. The patterning slit sheet 150 is bound inside the frame 155. The patterning slit sheet 150 includes a plurality of patterning slits 151 arranged in the X-axis direction. The deposition material 115 that is vaporized in the deposition source 110, passes through the deposition source nozzle unit 120 and the patterning slit sheet 150 towards the substrate 600. The patterning slit sheet 150 may be manufactured by etching, which is the same method as used in a conventional method of manufacturing an FMM, and in particular, a striped FMM.

In the thin film deposition assembly 100, the patterning slits 151 may have different lengths. This will be described in detail with reference to FIG. 6A.

In the thin film deposition assembly 100, the total number of patterning slits 151 may be greater than the total number of deposition source nozzles 121. In addition, there may be a greater number of patterning slits 151 than deposition source nozzles 121 disposed between two adjacent barrier plates 131.

In other words, at least one deposition source nozzle 121 may be disposed between each two adjacent barrier plates 131. Meanwhile, a plurality of patterning slits 151 may be disposed between each two adjacent barrier plates 131. The space between the deposition source nozzle unit 120 and the patterning slit sheet 150 is partitioned by the barrier plates 131 into sub-deposition spaces S that correspond to the deposition source nozzles 121, respectively. Thus, the deposition material 115 discharged from each of the deposition source nozzles 121 passes through a plurality of patterning slits 151 disposed in the sub-deposition space S corresponding to the deposition source nozzle 121, and is then deposited on the substrate 600.

In addition, the barrier plate assembly 130 and the patterning slit sheet 150 may be formed to be separated from each other by a predetermined distance. Alternatively, the barrier plate assembly 130 and the patterning slit sheet 150 may be connected by a connection member 135. The temperature of the barrier plate assembly 130 may increase to 100° C. or higher due to the deposition source 110 whose temperature is high. Thus, in order to prevent the heat of the barrier plate assembly 130 from being conducted to the patterning slit sheet 150, the barrier plate assembly 130 and the patterning slit sheet 150 are separated from each other by a predetermined distance.

As described above, the thin film deposition assembly 100 performs deposition while being moved relative to the substrate 600. In order to move the thin film deposition assembly 100 relative to the substrate 600, the patterning slit sheet 150 is separated from the substrate 600 by a predetermined distance. In addition, in order to prevent the formation of a relatively large shadow zone on the substrate 600 when the patterning slit sheet 150 and the substrate 600 are separated from each other, the barrier plates 131 are arranged between the deposition source nozzle unit 120 and the patterning slit sheet 150 to force the deposition material 115 to move in a straight direction. Thus, the size of the shadow zone formed on the substrate 600 is sharply reduced.

In particular, in a conventional deposition method using an FMM, deposition is performed with the FMM in close contact with a substrate in order to prevent formation of a shadow zone on the substrate. However, when the FMM is used in close contact with the substrate, the contact may cause defects. In addition, in the conventional deposition method, the size of the mask has to be the same as the size of the substrate since the mask cannot be moved relative to the substrate. Thus, the size of the mask has to be increased as display devices become larger. However, it is not easy to manufacture such a large mask.

In order to overcome this problem, in the thin film deposition assembly 100, the patterning slit sheet 150 is disposed to be separated from the substrate 600 by a predetermined distance. This may be facilitated by installing the barrier plates 131 to reduce the size of the shadow zone formed on the substrate 600.

As described above, according to an embodiment of the present invention, a mask is formed to be smaller than a substrate, and deposition is performed while the mask is moved relative to the substrate. Thus, the mask can be easily manufactured. In addition, defects caused due to the contact between a substrate and an FMM, which occurs in the conventional deposition method, may be prevented. In addition, since it is unnecessary to use the FMM in close contact with the substrate during a deposition process, the manufacturing speed may be improved. As described above, the shadow zone formed on the substrate 600 may be reduced by installing the barrier plates 131. Thus, the patterning slit sheet 150 can be separated from the substrate 600.

Hereinafter, the patterning slit sheet 150 of the thin film deposition assembly 100 according to an embodiment of the present invention will be described in detail.

Figure 6A:
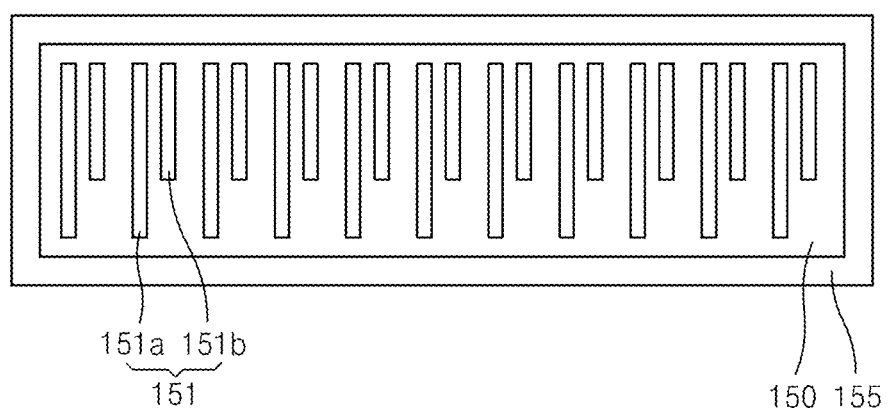
FIG. 6A is a plan view of a patterning slit sheet in the thin film deposition assembly illustrated in FIG. 3.

FIG. 6A is a plan view of a patterning slit sheet 150 in the thin film deposition assembly illustrated in FIG. 3; Referring to FIG. 6A, in the thin film deposition assembly, the patterning slits 151 may have different lengths.

As described above, in an organic light-emitting display device manufactured using the thin film deposition apparatus according to an embodiment of the present invention, organic layers, including auxiliary layers 62R' and 62G' (see FIG. 2), in R, G, and B sub-pixels, which respectively emit red, green and blue light, may have different thicknesses. In this regard, the thickness of each of the sub-pixels may be adjusted by controlling the thicknesses of the auxiliary layers 62R' and 62G' (see FIG. 2). In other words, the auxiliary layer 62R' (see FIG. 2) in the R sub-pixel may be the thickest, the auxiliary layer 62G' (see FIG. 2) in the G sub-pixel may be thinner than the auxiliary layer 62R', and an auxiliary layer in the B sub-pixel may be thinner than the auxiliary layer 62G' or may not be formed at all.

Meanwhile, in the conventional FMM deposition method, only a single layer can be stacked by a single process, and thus the auxiliary layer 62R' (see FIG. 2) in the R sub-pixel and auxiliary layer 62G' (see FIG. 2) in the G sub-pixel need to be deposited using separate processes.

However, the auxiliary layer 62R' (see FIG. 2) in the R sub-pixel and the auxiliary layer 62G' (see FIG. 2) in the G sub-pixel are formed of the same material and only the thicknesses and deposition positions of the auxiliary layer 62R' and the auxiliary layer 62G' are different from each other. Thus, in the thin film deposition assembly 100, the auxiliary layer 62R' and the auxiliary layer 62G' may be simultaneously formed by installing the patterning slits 151 of the R, G, and B sub-pixel regions to have different lengths.

In other words, the patterning slits 151 includes first patterning slits 151a and second patterning slits 151b. In this regard, the first patterning slits 151a are formed so as to correspond to the R sub-pixel region, and the second patterning slits 151b are formed so as to correspond to the G sub-pixel region. In other words, since a deposition material that has passed through the patterning slit 151 can only be deposited on the substrate 600, the thickness of an organic layer that is deposited on the substrate 600 increases as the size of the patterning slit 151 increases. Accordingly, the first patterning slits 151a for forming the auxiliary layer 62R' (see FIG. 2) in the R sub-pixel that is the thickest have to be the longest, the second patterning slits 151b for forming the auxiliary layer 62G' (see FIG. 2) in the G sub-pixel that is thinner than the auxiliary layer 62R' have to be shorter than the first patterning slits 151a, and the patterning slits are not formed in a region corresponding to the B sub-pixel. Although the patterning slits are not formed in a region corresponding to the B sub-pixel in FIG. 6A, the present invention is not limited thereto. If an auxiliary layer is required to be formed in the B sub-pixel region, a patterning slit may be formed such as to correspond thereto.

By using patterning slits having different lengths, a relatively large amount of the deposition material may be passed through a relatively long patterning slit for a region on which a relatively large amount of the deposition material is required to be deposited, and a relatively small amount of the deposition material may be passed through a relatively short patterning slit for a region on which a relatively small amount of the deposition material is required to be deposited to simultaneously form two layers. Thus, the number of the thin film deposition assemblies may be reduced, the time it takes to manufacture the organic light-emitting display device is sharply reduced, and equipment used to manufacture the organic light=emitting display device may be simplified.

Figure 6B:
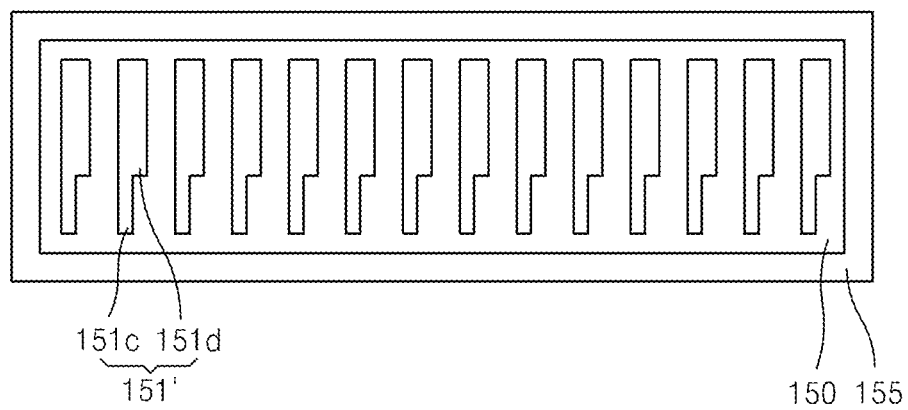
FIGS. 6B-6E are plan views of other patterning slit sheets for use in the thin film deposition assembly illustrated in FIG. 3.

FIG. 6B is a plan view of a modification of the patterning slit sheet of FIG. 6A. As shown in FIG. 6B, first patterning slits 151c and second patterning slits 151d having different lengths may be integrally formed. In this case, a patterning slit sheet 151' may be efficiently manufactured.

Figure 6C:
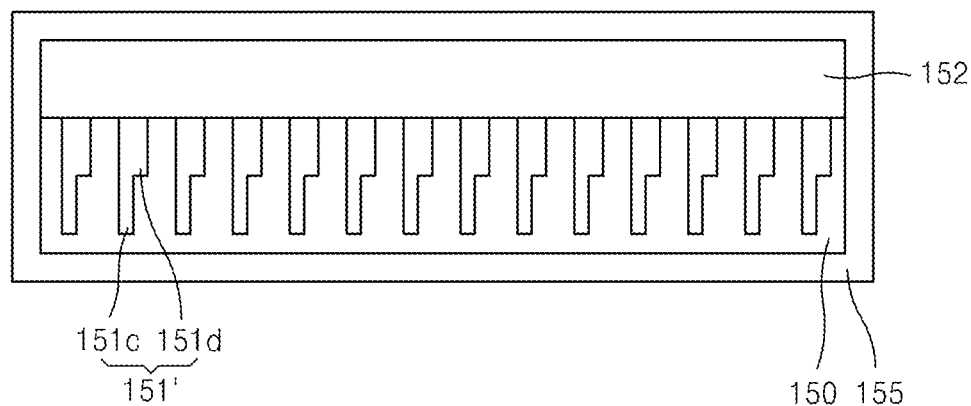

Meanwhile, the thickness of the organic layer 62 (FIG. 2) may be changed in order to optimize the structure of the organic light-emitting diode. Accordingly, the thicknesses of the auxiliary layers 62R' and 62G' (FIG. 2) may also be changed. In this regard, a deposition blade 152 may further be disposed as shown in FIG. 6C so as not to manufacture the patterning slit sheet 151' whenever the thicknesses of the auxiliary layers 62R' and 62G' (FIG. 2) are changed. In other words, using the deposition blade 152 that screens a part of the patterning slit sheet 151', the thicknesses of the auxiliary layers 62R' and 62G' (FIG. 2) may be adjusted by controlling the area of the deposition blade 152 without manufacturing a separate pattern slit sheet.

Figure 6D:
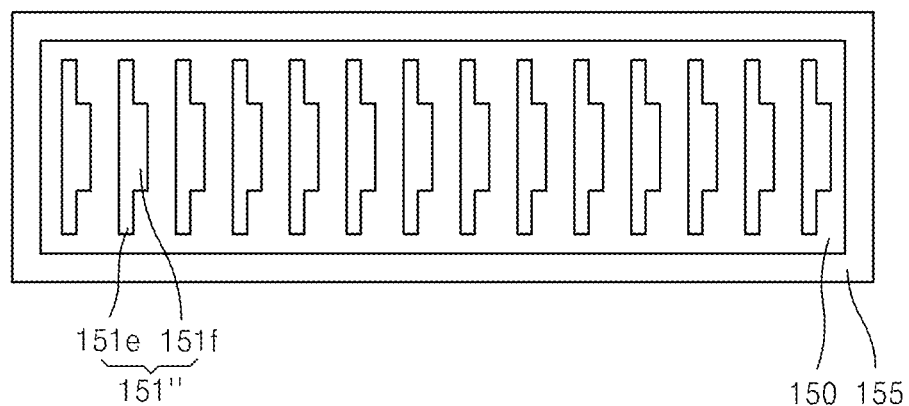

Meanwhile, if the patterning slit sheet 151' is disposed as shown in FIG. 6B, the upper and lower portions of the pattern slit sheet 151' are asymmetrical. Thus, the pattern slit sheet 151' may not be easily manufactured. In order to overcome this, a pattern slit sheet 151" may be formed such that second patterning slits 151f are disposed at the centers of first patterning slits 151e as shown in FIG. 6D.

Figure 6E:
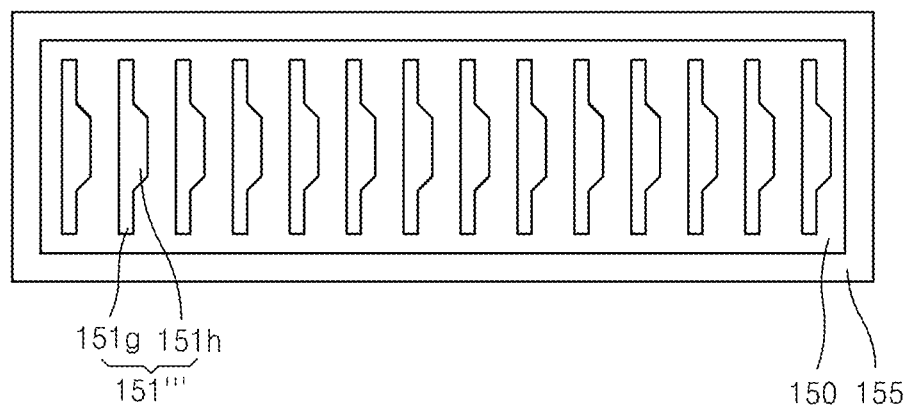

Furthermore, in order to minimize deformation of the patterning slit sheet 151' caused by extension, the patterning slit sheet 151" may be formed such that second patterning slits 151h are disposed at the centers of first patterning slits 151g and both ends of the second patterning slits 151h are inclined as shown in FIG. 6E.

Figure 7:
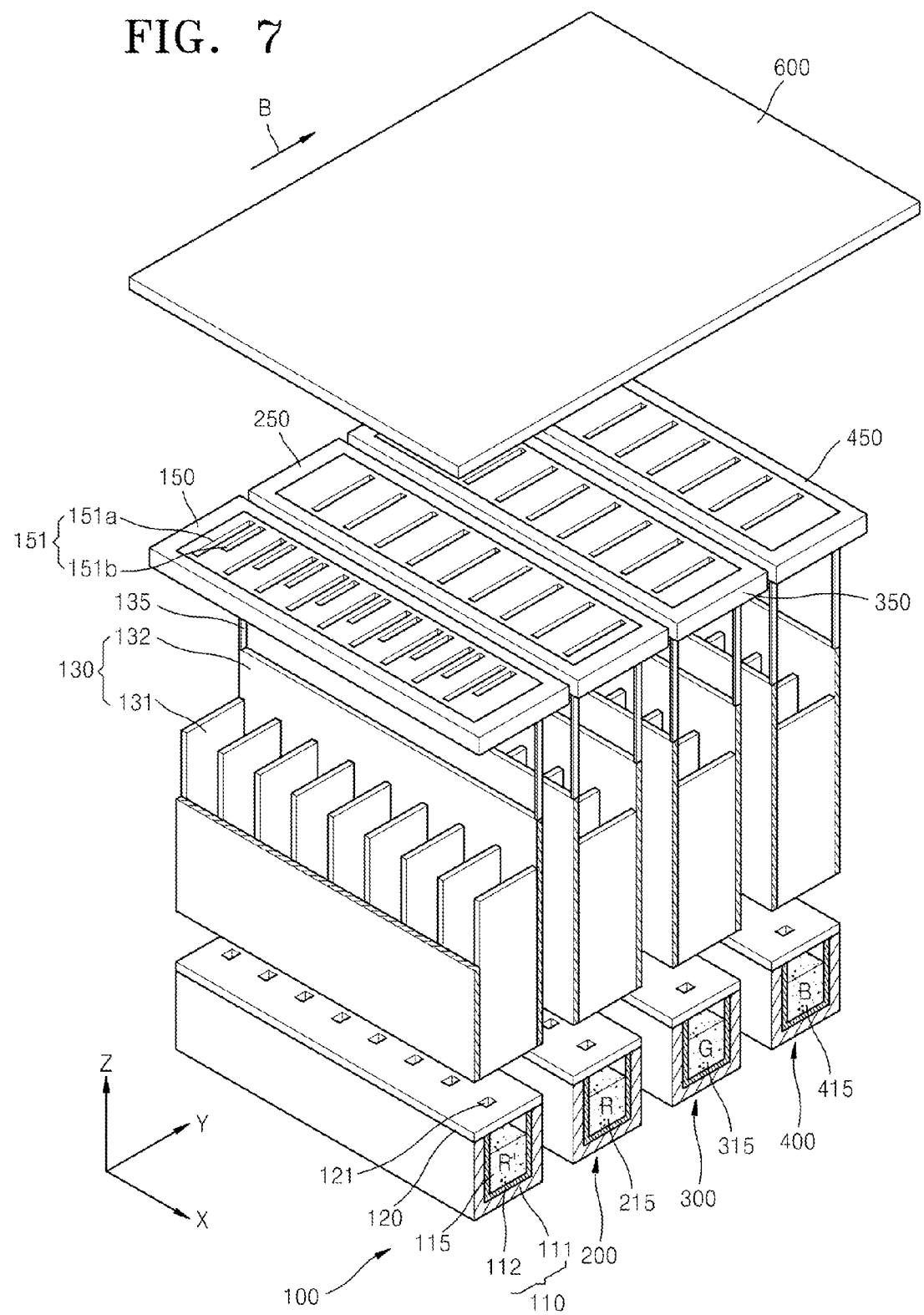
FIG. 7 is a schematic perspective view of a thin film deposition apparatus according to another embodiment of the present invention.

FIG. 7 is a schematic perspective view of a thin film deposition apparatus according to another embodiment of the present invention.

Referring to FIG. 7, the thin film deposition apparatus includes a plurality of thin film deposition assemblies, each of which has the structure of the thin film deposition assembly 100 illustrated in FIGS. 3 through 6. In other words, the thin film deposition apparatus may include a multi-deposition source that simultaneously discharges deposition materials for forming auxiliary layers R' and G', an R emission layer, a G emission layer, and a B emission layer.

In particular, the thin film deposition apparatus includes a first thin film deposition assembly 100, a second thin film deposition assembly 200, a third thin film deposition assembly 300, and a fourth thin film deposition assembly 400. Each of the first thin film deposition assembly 100, the second thin film deposition assembly 200, the third thin film deposition assembly 300, and the fourth thin film deposition assembly 400 has the same structure as the thin film deposition assembly described with reference to FIGS. 3 through 6, and thus a detailed description thereof will not be provided here.

The deposition sources of the first thin film deposition assembly 100, the second thin film deposition assembly 200, the third thin film deposition assembly 300, and fourth thin film deposition assembly 400 may contain different deposition materials, respectively. For example, the first thin film deposition assembly 100 may contain a deposition material for forming auxiliary layers R' and G', the second thin film deposition assembly 200 may contain a deposition material for forming an R emission layer, the third thin film deposition assembly 300 may contain a deposition material for forming a G emission layer, and the fourth thin film deposition assembly 400 may contain a deposition material for forming a B emission layer.

In other words, in a conventional method of manufacturing an organic light-emitting display device, a separate chamber and mask are used to form each color emission layer. However, when the thin film deposition apparatus is used, the auxiliary layers R' and G', the R emission layer, the G emission layer and the B emission layer may be formed at the same time with a single multi-deposition source. Thus, the time it takes to manufacture the organic light-emitting display device is sharply reduced. In addition, the organic light-emitting display device may be manufactured with less chambers, so that equipment costs are also markedly reduced.

In this regard, the patterning slit sheet 150 of the first thin film deposition assembly 100 may include the first patterning slits 151a and the second patterning slits 151b which have different lengths as described above. Here, the first patterning slits 151a are formed such as to correspond to the R sub-pixel region, and the second patterning slits 151b are formed such as to correspond to the G sub-pixel region.

In addition, a patterning slit sheet 250 of the second thin film deposition assembly 200, a patterning slit sheet 350 of the third thin film deposition assembly 300, and a patterning slit sheet 450 of the fourth thin film deposition assembly 400 may be arranged to be offset by a constant distance with respect to one another, in order for deposition regions corresponding to the patterning slit sheets 250, 350 and 450 not to overlap on the substrate 600. In other words, when the second thin film deposition assembly 200, the third thin film deposition assembly 300, and the fourth thin film deposition assembly 400 are used to deposit an R emission layer, a G emission layer and a B emission layer, respectively, patterning slits 251 of the second thin film deposition assembly 200, patterning slits 351 of the third thin film deposition assembly 300, and patterning slits 451 of the fourth thin film deposition assembly 400 are arranged not to be aligned with respect to one another, in order to form the R emission layer, the G emission layer and the B emission layer in different regions of the substrate 600.

In addition, the deposition materials for forming the auxiliary layers R' and G', the R emission layer, the G emission layer, and the B emission layer may have different deposition temperatures. Therefore, the temperatures of the deposition sources 110, 210, 310, and 410 of the respective first, second, third, and fourth thin film deposition assemblies 100, 200, 300, and 400 may be set to be different.

Although the thin film deposition apparatus includes four thin film deposition assemblies, the present invention is not limited thereto. In other words, a thin film deposition apparatus may include a plurality of thin film deposition assemblies, each of which contains a different deposition material.

As described above, a plurality of thin films may be formed at the same time with a plurality of thin film deposition assemblies, and thus manufacturing yield and deposition efficiency are improved. In addition, the overall manufacturing process is simplified, and the manufacturing costs are reduced.

Organic layers (refer to the organic layer 62 in FIG. 2), including the emission layer, of an organic light-emitting display device may be formed with a thin film deposition apparatus having the structure described above. A method of manufacturing an organic light-emitting display device according to an embodiment of the present invention may include: arranging the substrate 600 to be separated from the thin film deposition apparatus by a predetermined distance; and depositing a deposition material discharged from the thin film deposition apparatus on the substrate 600 while moving the thin film deposition apparatus or the substrate 600 relative to each other.

This will now be described in detail below.

Initially, the substrate 600 is arranged to be separated from the thin film deposition apparatus by a predetermined distance. As described above, the thin film deposition apparatus may include the patterning slit sheets 150, 250, 350, and 450 each of which is smaller than the substrate 600, and thus may be relatively easily manufactured. Thus, deposition may be performed while the thin film deposition apparatus or the substrate 600 is moved relative to each other. In other words, deposition may be continuously performed while the substrate 600, which is arranged opposite to the thin film deposition apparatus, is moved in the Y-axis direction. In other words, deposition is performed in a scanning manner while the substrate 600 is moved in a direction of an arrow B in FIG. 7. In addition, the thin film deposition apparatus and the substrate 600 have to be separated from each other by a predetermined distance in order to move the thin film deposition apparatus or the substrate 600 relative to each other. For this reason, the substrate 600 is arranged in a chamber (not shown) to be separated from the thin film deposition apparatus by a predetermined distance.

Next, a deposition material discharged from the thin film deposition apparatus is deposited on the substrate 600 while the thin film deposition apparatus or the substrate 600 is moved relative to each other. As described above, the thin film deposition apparatus may include the patterning slit sheets 150, 250, 350, and 450, each of which is smaller than the substrate 600, and thus may be relatively easily manufactured. Thus, deposition is performed while the thin film deposition apparatus or the substrate 600 is moved relative to each other. Although FIG. 7 illustrates that the substrate 600 is moved in the Y-axis direction while the thin film deposition apparatus is fixed, the present invention is not limited thereto. For example, the substrate 600 may be fixed and the thin film deposition apparatus may be moved relative to the substrate 600.

The thin film deposition apparatus for performing the method of manufacturing an organic light-emitting display device according to an embodiment of the present invention may include a multi-deposition source that simultaneously discharges deposition materials for forming auxiliary layers R' and G', an R emission layer, a G emission layer and a B emission layer. Thus, a plurality of organic layers may be simultaneously formed. In other words, the thin film deposition apparatus used to perform the method may include a plurality of thin film deposition assemblies, so that the auxiliary layers R' and G', the R emission layer, the G emission layer and the B emission layer may be formed at the same time with a single multi-deposition source. Thus, the time taken to manufacture the organic light-emitting display device is sharply reduced, and equipment costs are also markedly reduced since less chambers may be used.

Figure 8:
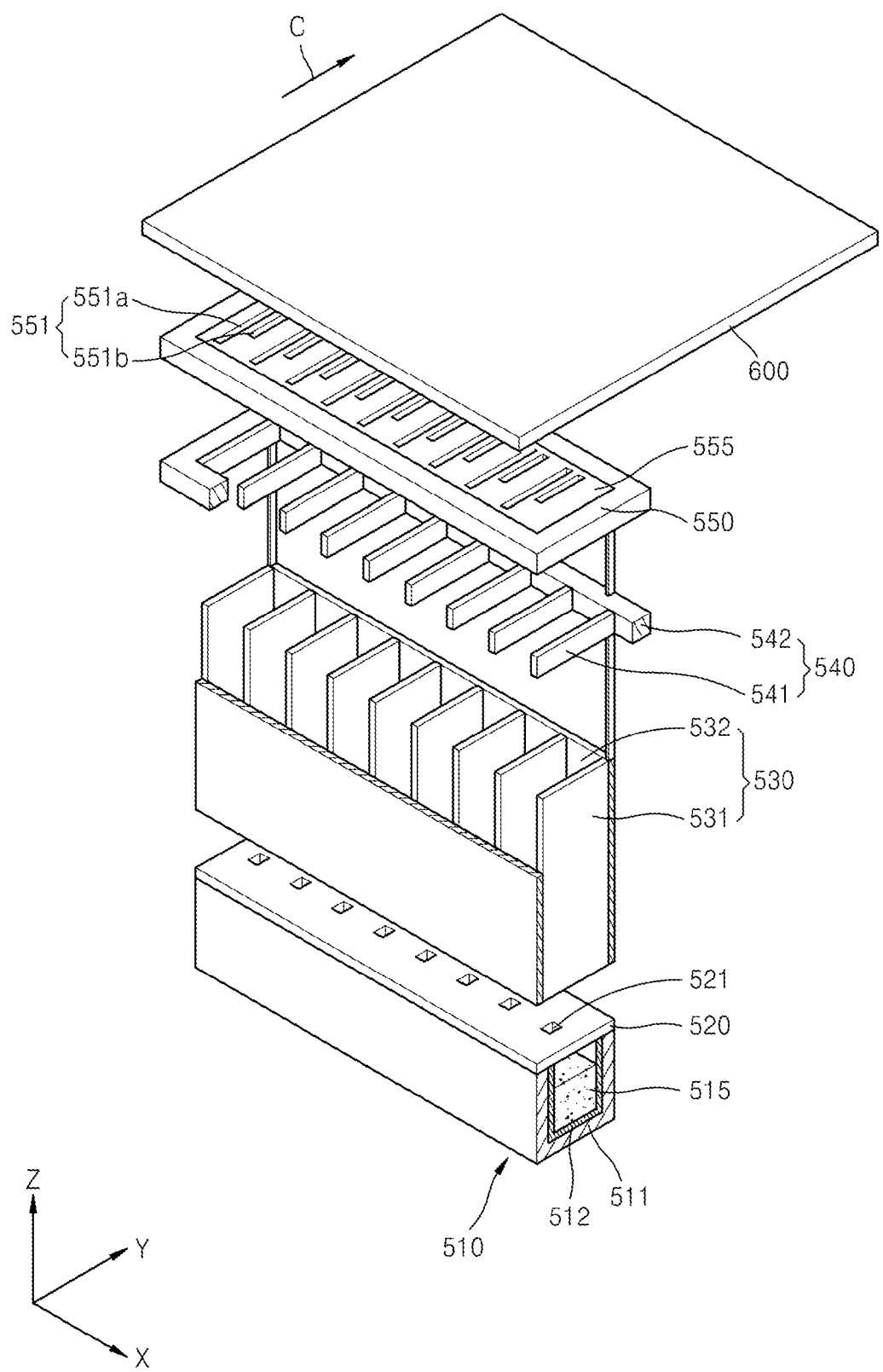
FIG. 8 is a schematic perspective view of a thin film deposition assembly according to another embodiment of the present invention.

FIG. 8 is a schematic perspective view of a thin film deposition assembly 500 according to another embodiment of the present invention.

Referring to FIG. 8, the thin film deposition assembly 500 includes a deposition source 510, a deposition source nozzle unit 520, a first barrier plate assembly 530, a second barrier plate assembly 540, a patterning slit sheet 550, and a substrate 600.

Although a chamber is not illustrated in FIG. 8 for convenience of explanation, all the components of the thin film deposition assembly 500 may be disposed within a chamber that is maintained at an appropriate degree of vacuum. The chamber is maintained at an appropriate vacuum in order to allow a deposition material to move in a substantially straight line through the thin film deposition apparatus.

The substrate 600, which constitutes a target on which a deposition material 515 is to be deposited, is disposed in the chamber. The deposition source 510 that contains and heats the deposition material 515 is disposed in an opposite side of the chamber to that in which the substrate 600 is disposed. The deposition source 510 may include a crucible 511 and a heater 512.

The deposition source nozzle unit 520 is disposed at a side of the deposition source 510, and in particular, at the side of the deposition source 510 facing the substrate 600. The deposition source nozzle unit 520 includes a plurality of deposition source nozzles 521 arranged in the X-axis direction.

The first barrier plate assembly 530 is disposed at a side of the deposition source nozzle unit 520. The first barrier plate assembly 530 includes a plurality of first barrier plates 531, and a first barrier plate frame 532 that covers sides of the first barrier plates 531.

The second barrier plate assembly 540 is disposed at a side of the first barrier plate assembly 530. The second barrier plate assembly 540 includes a plurality of second barrier plates 541, and a second barrier plate frame 542 that covers sides of the second barrier plates 541.

The patterning slit sheet 550 and a frame 555 in which the patterning slit sheet 550 is bound are disposed between the deposition source 510 and the substrate 600. The frame 555 may be formed in a lattice shape, similar to a window frame. The patterning slit sheet 550 includes a plurality of patterning slits 551 arranged in the X-axis direction.

The thin film deposition assembly 500 includes two separate barrier plate assemblies, i.e., the first barrier plate assembly 530 and the second barrier plate assembly 540, unlike the thin film deposition assembly 100 illustrated in FIG. 3, which includes one barrier plate assembly 130.

The plurality of first barrier plates 531 may be arranged parallel to each other at equal intervals in the X-axis direction. In addition, each of the first barrier plates 531 may be formed to extend along an YZ plane in FIG. 8, i.e., perpendicular to the X-axis direction.

The plurality of second barrier plates 541 may be arranged parallel to each other at equal intervals in the X-axis direction. In addition, each of the second barrier plates 541 may be formed to extend along the YZ plane in FIG. 8, i.e., perpendicular to the X-axis direction.

The plurality of first barrier plates 531 and second barrier plates 541 arranged as described above partition the space between the deposition source nozzle unit 520 and the patterning slit sheet 550. In the thin film deposition assembly 500, the deposition space is divided by the first barrier plates 531 and the second barrier plates 541 into sub-deposition spaces that respectively correspond to the deposition source nozzles 521 through which the deposition material 515 is discharged.

The second barrier plates 541 may be disposed to correspond respectively to the first barrier plates 531. In other words, the second barrier plates 541 may be respectively disposed to be parallel to and to be on the same plane as the first barrier plates 531. Each pair of the corresponding first and second barrier plates 531 and 541 may be located on the same plane. As described above, since the space between the deposition source nozzle unit 520 and the patterning slit sheet 550, which will be described later, is partitioned by the first barrier plates 531 and the second barrier plates 541, which are disposed parallel to each other, the deposition material 515 discharged through one of the deposition source nozzles 521 is not mixed with the deposition material 515 discharged through the other deposition source nozzles 521, and is deposited on the substrate 600 through the patterning slits 551. In other words, the first barrier plates 531 and the second barrier plates 541 guide the deposition material 515, which is discharged through the deposition source nozzles 521, not to flow in the X-axis direction.

Although the first barrier plates 531 and the second barrier plates 541 are respectively illustrated as having the same thickness in the X-axis direction, the present invention is not limited thereto. In other words, the second barrier plates 541, which need to be accurately aligned with the patterning slit sheet 550, may be formed to be relatively thin, whereas the first barrier plates 531, which do not need to be precisely aligned with the patterning slit sheet 550, may be formed to be relatively thick. This makes it easier to manufacture the thin film deposition assembly.

Although not illustrated, a thin film deposition apparatus according to an embodiment of the present invention may include a plurality of thin film deposition assemblies, each of which has the structure illustrated in FIG. 8. In other words, the thin film deposition apparatus may include a multi-deposition source that simultaneously discharges deposition materials for forming auxiliary layers R' and G', a R emission layer, a G emission layer, and a B emission layer. Deposition is performed in a scanning manner while the substrate 600 is moved in a direction of an arrow C in FIG. 8. Since the plurality of thin film deposition assemblies have been described in detail in the previous embodiment, a detailed description thereof will not be provided here.

Figure 9:
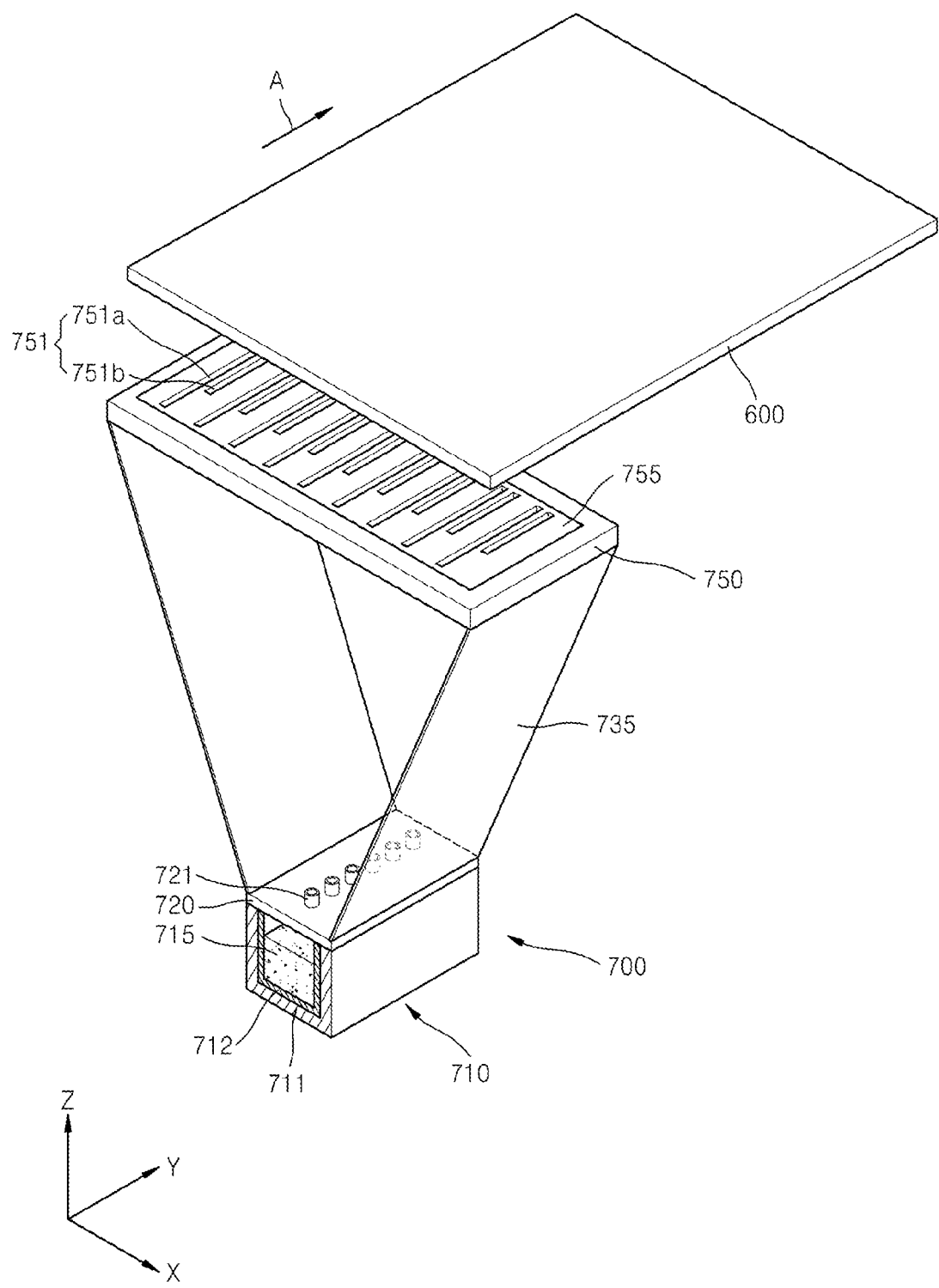
FIG. 9 is a schematic perspective view of a thin film deposition assembly according to another embodiment of the present invention.
Figure 10:
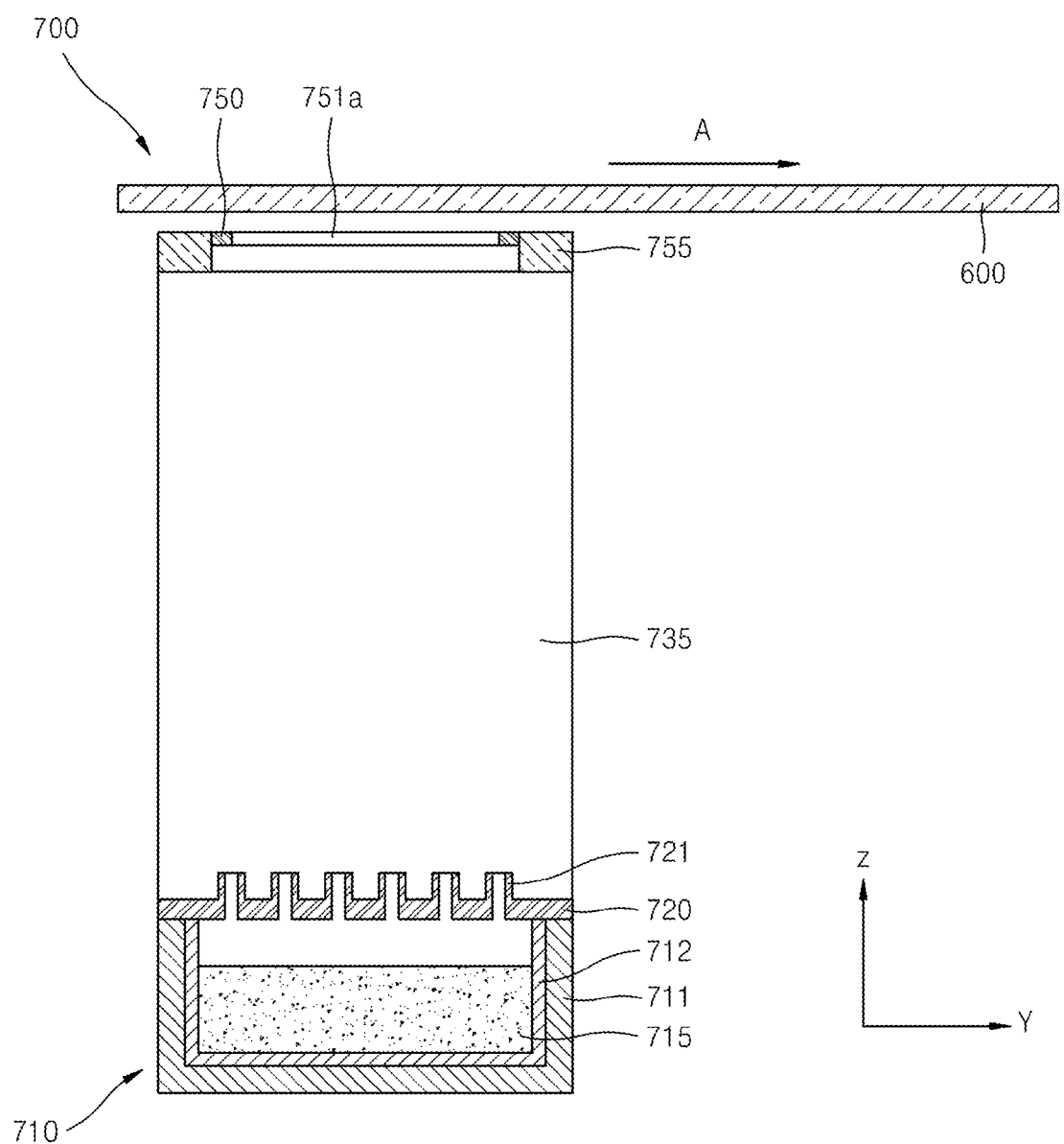
FIG. 10 is a schematic sectional view of the thin film deposition assembly illustrated in FIG. 9.
Figure 11:
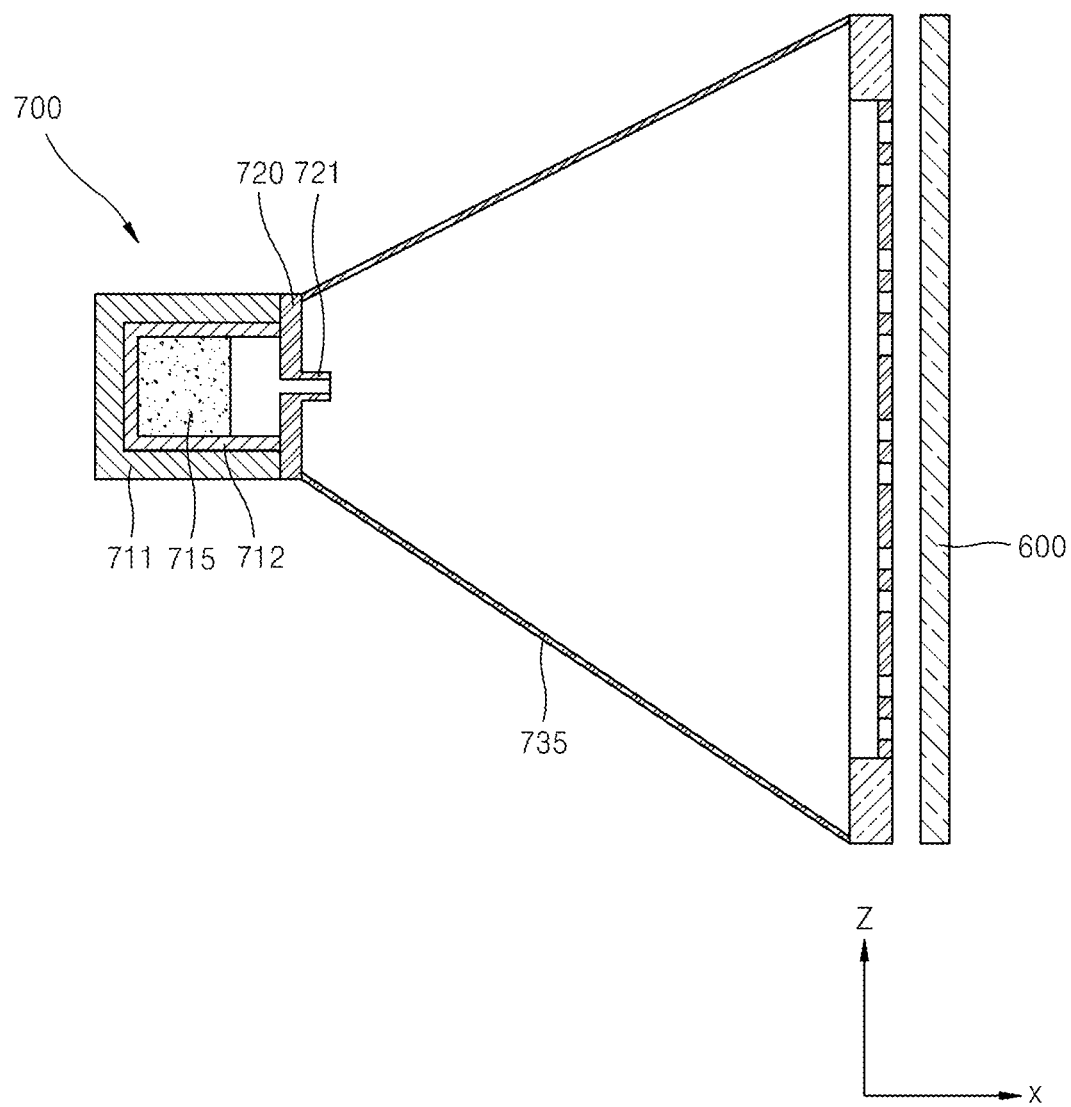
FIG. 11 is a schematic plan view of the thin film deposition assembly illustrated in FIG. 9.

FIG. 9 is a schematic perspective view of a thin film deposition assembly 700 according to another embodiment of the present invention, FIG. 10 is a schematic sectional view of the thin film deposition assembly 700 illustrated in FIG. 9, and FIG. 11 is a schematic plan view of the thin film deposition assembly 700 illustrated in FIG. 9.

Referring to FIGS. 9, 10 and 11, the thin film deposition assembly 700 includes a deposition source 710, a deposition source nozzle unit 720, and a patterning slit sheet 750.

Although a chamber is not illustrated in FIGS. 9, 10 and 11 for convenience of explanation, all the components of the thin film deposition assembly 700 may be disposed within a chamber that is maintained at an appropriate degree of vacuum. The chamber is maintained at an appropriate vacuum in order to allow a deposition material to move in a substantially straight line through the thin film deposition apparatus.

The substrate 600, which constitutes a target on which a deposition material 715 is to be deposited, is disposed in the chamber. The deposition source 710 that contains and heats the deposition material 715 is disposed in an opposite side of the chamber to that in which the substrate 600 is disposed. The deposition source 710 may include a crucible 711 and a heater 712.

The deposition source nozzle unit 720 is disposed at a side of the deposition source 710, and in particular, at the side of the deposition source 710 facing the substrate 600. The deposition source nozzle unit 720 includes a plurality of deposition source nozzles 721 arranged at equal intervals in the Y-axis direction, that is the scanning direction of the substrate 600. The deposition material 715 that is vaporized in the deposition source 710, passes through the deposition source nozzle unit 720 towards the substrate 600. As described above, when the plurality of deposition source nozzles 721 are formed on the deposition source nozzle unit 720 in the Y-axis direction, that is, the scanning direction of the substrate 600, a size of the pattern formed by the deposition material that is discharged through each of patterning slits 751 in the patterning slit sheet 750 is only affected by the size of one deposition source nozzle 721, that is, it may be considered that one deposition nozzle 721 exists in the X-axis direction, and thus there is no shadow zone on the substrate. In addition, since the plurality of deposition source nozzles 721 are formed in the scanning direction of the substrate 600, even if there is a difference between fluxes of the deposition source nozzles 721, the difference may be compensated and deposition uniformity may be constantly maintained.

The patterning slit sheet 750 and a frame 755 in which the patterning slit sheet 750 is bound are disposed between the deposition source 710 and the substrate 600. The frame 755 may be formed in a lattice shape, similar to a window frame. The patterning slit sheet 750 is bound inside the frame 755. The patterning slit sheet 750 includes a plurality of patterning slits 751 arranged in the X-axis direction. The deposition material 715 that is vaporized in the deposition source 710, passes through the deposition source nozzle unit 720 and the patterning slit sheet 750 towards the substrate 600. The patterning slit sheet 750 may be manufactured by etching, which is the same method as used in a conventional method of manufacturing an FMM, and in particular, a striped FMM.

In the thin film deposition assembly 100, the auxiliary layer 62R' (see FIG. 2) in the R sub-pixel and the auxiliary layer 62G' (see FIG. 2) in the G sub-pixel may be simultaneously formed by installing the patterning slits 751 of the R, G, and B sub-pixel regions to have different lengths. In other words, the patterning slits 751 includes first patterning slits 751a and second patterning slits 751b. In this regard, the first patterning slits 751a are formed so as to correspond to the R sub-pixel region, and the second patterning slits 751b are formed so as to correspond to the G sub-pixel region. In this regard, the first patterning slits 751a for forming the auxiliary layer 62R' (see FIG. 2) in the R sub-pixel that is the thickest have to be the longest, the second patterning slits 751b for forming the auxiliary layer 62G' (see FIG. 2) in the G sub-pixel that is thinner than the auxiliary layer 62R' have to be shorter than the first patterning slits 751a, and the patterning slits are not formed in a region corresponding to the B sub-pixel. Since the patterning slits 751 have been described in detail in the previous embodiment, a detailed description thereof will not be provided here.

In addition, the deposition source 710 (and the deposition source nozzle unit 720 coupled to the deposition source 710) and the patterning slit sheet 750 may be formed to be separated from each other by a predetermined distance. Alternatively, the deposition source 710 (and the deposition source nozzle unit 720 coupled to the deposition source 710) and the patterning slit sheet 750 may be connected by a connection member 735. That is, the deposition source 710, the deposition source nozzle unit 720, and the patterning slit sheet 750 may be formed integrally with each other by being connected to each other via the connection member 735. The connection member 735 guides the deposition material 715, which is discharged through the deposition source nozzles 721, to move straight, not to flow in the X-axis direction. In FIGS. 9 through 11, the connection members 735 are formed on left and right sides of the deposition source 710, the deposition source nozzle unit 720, and the patterning slit sheet 750 to guide the deposition material 715 not to flow in the X-axis direction, however, the present invention is not limited thereto. That is, the connection member 735 may be formed as a sealed type of a box shape to simultaneously guide flow of the deposition material 715 not to flow in the X-axis and Y-axis directions.

As described above, the thin film deposition assembly 700 performs deposition while being moved relative to the substrate 600. In order to move the thin film deposition assembly 700 relative to the substrate 600, the patterning slit sheet 750 is separated from the substrate 600 by a predetermined distance.

As described above, a mask is formed to be smaller than a substrate, and deposition is performed while the mask is moved relative to the substrate. Thus, the mask can be easily manufactured. In addition, defects caused due to the contact between a substrate and an FMM, which occurs in the conventional deposition method, may be prevented. In addition, since it is unnecessary to use the FMM in close contact with the substrate during a deposition process, the manufacturing speed may be improved.

Figure 12:
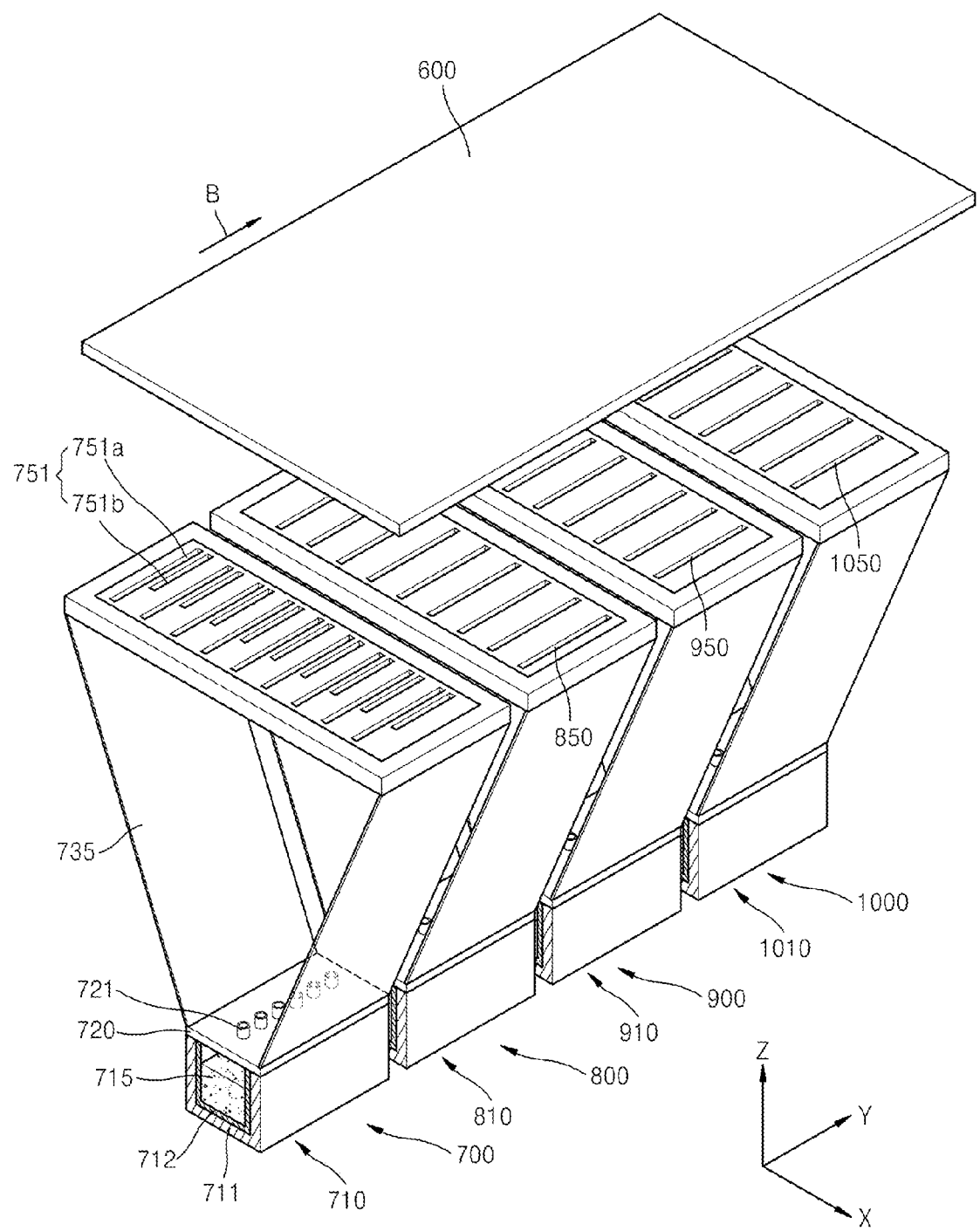
FIG. 12 is a schematic perspective view of a thin film deposition apparatus according to another embodiment of the present invention.

FIG. 12 is a schematic perspective view of a thin film deposition apparatus according to another embodiment of the present invention.

Referring to FIG. 12, the thin film deposition apparatus includes a plurality of thin film deposition assemblies, each of which has the structure of the thin film deposition assembly 700 illustrated in FIGS. 9 through 11. In other words, the thin film deposition apparatus may include a multi-deposition source that simultaneously discharges deposition materials for forming the auxiliary layers R' and G', the R emission layer, the G emission layer, and the B emission layer.

In particular, the thin film deposition apparatus includes a first thin film deposition assembly 700, a second thin film deposition assembly 800, a third thin film deposition assembly 900, and a fourth thin film deposition assembly 1000. Each of the first thin film deposition assembly 700, the second thin film deposition assembly 800, the third thin film deposition assembly 900, and the fourth thin film deposition assembly 1000 has the same structure as the thin film deposition assembly described with reference to FIGS. 9 through 11, and thus a detailed description thereof will not be provided here.

The deposition sources of the first thin film deposition assembly 700, the second thin film deposition assembly 800, the third thin film deposition assembly 900, and fourth thin film deposition assembly 1000 may contain different deposition materials, respectively. For example, the first thin film deposition assembly 700 may contain a deposition material for forming auxiliary layers R' and G', the second thin film deposition assembly 800 may contain a deposition material for forming an R emission layer, the third thin film deposition assembly 900 may contain a deposition material for forming a G emission layer, and the fourth thin film deposition assembly 1000 may contain a deposition material for forming a B emission layer.

In other words, in a conventional method of manufacturing an organic light-emitting display device, a separate chamber and mask are used to form each color emission layer. However, when the thin film deposition apparatus according to an embodiment of the present invention is used, the auxiliary layers R' and G', the R emission layer, the G emission layer and the B emission layer may be formed at the same time with a single multi-deposition source. Thus, the time it takes to manufacture the organic light-emitting display device is sharply reduced. In addition, the organic light-emitting display device may be manufactured with less chambers, so that equipment costs are also markedly reduced.

In this regard, the patterning slit sheet 751 of the first thin film deposition assembly 700 may include the first patterning slits 751*a* and the second patterning slits 751*b* which have different lengths as described above. Here, the first patterning slits 751*a* are formed such as to correspond to the R sub-pixel region, and the second patterning slits 751*b* are formed such as to correspond to the G sub-pixel region.

In addition, a patterning slit sheet 850 of the second thin film deposition assembly 800, a patterning slit sheet 950 of the third thin film deposition assembly 900, a patterning slit sheet 1050 of the fourth thin film deposition assembly 1000 may be arranged to be offset by a constant distance with respect to each other, in order for deposition regions corresponding to the patterning slit sheets 850, 950 and 1050 not to overlap on the substrate 600. In other words, when the second thin film deposition assembly 800, the third thin film deposition assembly 900, and the fourth thin film deposition assembly 1000 are used to deposit an R emission layer, a G emission layer and a B emission layer, respectively, patterning slits 851 of the second thin film deposition assembly 800, patterning slits 951 of the third thin film deposition assembly 900, and patterning slits 1051 of the fourth thin film deposition assembly 1000 are arranged not to be aligned with respect to one another, in order to form the R emission layer, the G emission layer and the B emission layer in different regions of the substrate 600.

In addition, the deposition materials for forming the R emission layer, the G emission layer, and the B emission layer may have different deposition temperatures. Therefore, the temperatures of the deposition sources 710, 810, 910, and 1010 of the respective first, second, third, and fourth thin film deposition assemblies 700, 800, 900, and 1000 may be set to be different.

Although the thin film deposition apparatus illustrated in FIG. 12 includes four thin film deposition assemblies, the present invention is not limited thereto. In other words, a thin film deposition apparatus according to the aspects of the present invention may include a plurality of thin film deposition assemblies, each of which contains a different deposition material.

As described above, a plurality of thin films may be formed at the same time with a plurality of thin film deposition assemblies, and thus manufacturing yield and deposition efficiency are improved. In addition, the overall manufacturing process is simplified, and the manufacturing costs are reduced.

As described above, according to a thin film deposition apparatus, a method of manufacturing an organic light-emitting display device by using the thin film deposition apparatus, and an organic light-emitting display device manufactured by using the method according to aspects of the present invention, the thin film deposition apparatus may be easily used to manufacture large-sized display devices on a mass scale. In addition, the thin film deposition apparatus and the organic-light-emitting display device may be easily manufactured and may have high manufacturing yield and deposition efficiency.

While the aspects of the present invention have been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A method of manufacturing an organic light-emitting display device using a thin film deposition apparatus, the method comprising:
separating a thin film deposition assembly of the thin film deposition apparatus from a substrate that is fixedly supported by a chuck and performing deposition on the substrate while the thin film deposition assembly or the substrate fixedly supported by the chuck is moved relative to the other,
wherein the thin film deposition assembly comprises a deposition source that discharges a deposition material, a deposition source nozzle unit disposed at a side of the deposition source and including a plurality of deposition source nozzles arranged in a first direction, a patterning slit sheet disposed opposite to the deposition source nozzle unit and including a plurality of patterning slits having different lengths arranged in the first direction, and a barrier plate assembly disposed between the deposition source nozzle unit and the patterning slit sheet in the first direction, and including a plurality of barrier plates that partition a space between the deposition source nozzle unit and the patterning slit sheet into a plurality of sub-deposition spaces.

2. The method of claim 1, wherein the deposition material comprises an organic material, and auxiliary layers having different thicknesses are formed in red, green, and blue sub-pixels, which respectively emit red, green, and blue light, by the thin film deposition apparatus.

3. An organic light-emitting display device manufactured using the method of claim 1.

4. The method of claim 1, wherein the patterning slits comprise first patterning slits having a first length and second patterning slits having a second length that is different from the first length.

5. The method of claim 4, wherein the first patterning slits and the second patterning slits are alternatingly disposed.

6. The method of claim 4, wherein the first patterning slits are formed to correspond to a red sub-pixel region of the thin film, and the second patterning slits are formed to correspond to a green sub-pixel region of the thin film, wherein the first patterning slits are longer than the second patterning slits.

7. The method of claim 6, wherein no pattering slits are formed in a region of the patterning slit sheet corresponding to a blue sub-pixel region.

8. The method of claim 1, wherein amounts of the deposition material deposited on the substrate are controlled according to the lengths of the patterning slits.

9. The method of claim 1, wherein the deposition material discharged from the deposition source is concurrently deposited on a red sub-pixel region and a green sub-pixel region of the substrate.

10. The method of claim 9, wherein a thickness of the deposition material deposited on the red sub-pixel region of the substrate is greater than a thickness of the deposition material deposited on the green sub-pixel region of the substrate.

11. The method of claim 1, wherein each of the plurality of barrier plates extends in a second direction that is substantially perpendicular to the first direction, in order to partition the space between the deposition source nozzle unit and the patterning slit sheet into the plurality of sub-deposition spaces.

12. The method of claim 1, wherein the plurality of barrier plates are arranged at equal intervals.

13. The method of claim 1, wherein the barrier plate assembly comprises a first barrier plate assembly comprising a plurality of first barrier plates, and a second barrier plate assembly comprising a plurality of second barrier plates.

14. The method of claim 1, wherein the deposition material discharged from the thin film deposition apparatus is continuously deposited on the substrate while the substrate is moved relative to the thin film deposition apparatus.

15. The method of claim 1, wherein the thin film deposition apparatus or the substrate is movable relative to the other along a plane parallel to a surface of the substrate on which the deposition material is deposited.

16. The method of claim 1, wherein the patterning slit sheet of the thin film deposition assembly is smaller than the substrate.

17. A method of manufacturing an organic light-emitting display device, the method comprising:
separating a thin film deposition apparatus from a substrate that is fixedly supported by a chuck and performing deposition on the substrate while the thin film deposition apparatus or the substrate fixedly supported by the chuck is moved relative to the other in a first direction,
wherein the thin film deposition apparatus comprises a deposition source that discharges a deposition material, a deposition source nozzle unit disposed at a side of the deposition source and including a plurality of deposition source nozzles arranged along the first direction, and a patterning slit sheet disposed opposite to the deposition source nozzle unit and including a plurality of patterning slits having different lengths extending in the first direction and arranged along a second direction perpendicular to the first direction.

18. The method of claim 17, wherein the deposition material comprises an organic material, and auxiliary layers having different thicknesses are formed in red, green, and blue sub-pixels, which respectively emit red, green, and blue light, by the thin film deposition apparatus.

19. An organic light-emitting display device manufactured using the method of claim 17.

20. The method of claim 17, wherein the patterning slits comprise first patterning slits having a first length and second patterning slits having a second length that is different from the first length.

21. The method of claim 20, wherein the first patterning slits and the second patterning slits are alternately disposed.

22. The method of claim 20, wherein the first patterning slits are formed to correspond to a red sub-pixel region of the thin film, and the second patterning slits are formed to correspond to a green sub-pixel region of the thin film, wherein the first patterning slits are longer than the second patterning slits.

23. The method of claim 22, wherein no pattering slits are formed in a region of the patterning slit sheet corresponding to a blue sub-pixel region of the thin film.

24. The method of claim 17, wherein amounts of the deposition material deposited on the substrate are controlled according to the lengths of the patterning slits.

25. The method of claim 17, wherein the deposition material discharged from the deposition source is concurrently deposited on a red sub-pixel region of the substrate and a green sub-pixel region of the substrate.

26. The method of claim 25, wherein a thickness of the deposition material deposited on the red sub-pixel region of the substrate is greater than a thickness of the deposition material deposited on the green sub-pixel region of the substrate.

27. The method of claim 17, wherein the thin film deposition apparatus is separated from the substrate by a predetermined distance.

28. The method of claim 17, wherein the deposition material discharged from the thin film deposition apparatus is continuously deposited on the substrate while the substrate is moved relative to the thin film deposition apparatus in the first direction.

29. The method of claim 17, wherein the patterning slit sheet of the thin film deposition apparatus is smaller than the substrate.

30. A method of manufacturing an organic light-emitting display device, the method comprising:
separating a thin film deposition apparatus from a substrate that is fixedly supported by a chuck and performing deposition on the substrate while the thin film deposition apparatus or the substrate fixedly supported by the chuck is moved relative to the other,
wherein the thin film deposition apparatus comprises a deposition source that discharges a deposition material, a deposition source nozzle unit disposed at a side of the deposition source and including a plurality of deposition source nozzles arranged along a first direction, and a patterning slit sheet disposed opposite to the deposition source nozzle unit and including a plurality of patterning slits having different lengths arranged along a second direction perpendicular to the first direction,
wherein the deposition source and the deposition source nozzle unit, and the patterning slit sheet are connected to each other by a connection member.

31. The method of claim 30, wherein the connection member guides movement of the discharged deposition material.

32. The method of claim 30, wherein the connection member seals a space between the deposition source and the deposition source nozzle unit, and the patterning slit sheet.

* * * * *